US012751151B2

(12) United States Patent
Shin et al.

(10) Patent No.: US 12,751,151 B2
(45) Date of Patent: Sep. 29, 2026

(54) DISPLAY DEVICE AND METHOD OF FABRICATING THE SAME

(71) Applicant: Samsung Display Co., LTD., Yongin-si (KR)

(72) Inventors: Hyun Eok Shin, Yongin-si (KR); Joon Yong Park, Yongin-si (KR); Dong Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 357 days.

(21) Appl. No.: 18/534,848

(22) Filed: Dec. 11, 2023

(65) Prior Publication Data

US 2024/0373678 A1 Nov. 7, 2024

(30) Foreign Application Priority Data

May 4, 2023 (KR) ........................ 10-2023-0058450

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ............. H10K 59/122; H10K 59/1201; H10K 59/131; H10K 59/80522; H10K 59/124; H10K 59/8051; H10K 59/8052; H10K 71/60
See application file for complete search history.

(56) References Cited

U.S. PATENT DOCUMENTS

| | | | | |
|---|---|---|---|---|
| 11,348,983 | B1 | 5/2022 | Choung et al. | |
| 2023/0363211 | A1* | 11/2023 | Jung | G06F 3/0412 |
| 2023/0403884 | A1* | 12/2023 | Kim | H10K 59/122 |
| 2024/0074245 | A1* | 2/2024 | Lee | H10K 59/80522 |
| 2024/0188336 | A1* | 6/2024 | Choi | H10K 50/8445 |
| 2024/0215323 | A1* | 6/2024 | Shin | H10K 59/122 |
| 2024/0284716 | A1* | 8/2024 | Yoo | H10K 59/1315 |
| 2024/0357871 | A1* | 10/2024 | Shin | H10K 59/80522 |
| 2024/0373678 | A1* | 11/2024 | Shin | H10K 59/80522 |

* cited by examiner

*Primary Examiner* — Scott B Geyer
(74) *Attorney, Agent, or Firm* — CANTOR COLBURN LLP

(57) ABSTRACT

A display device includes anode electrodes, an inorganic insulating layer exposing each anode electrode, a bank member on the inorganic insulating layer and including an opening overlapping each anode electrode, a light emitting layer on each anode electrode and including a portion on the inorganic insulating layer, and a cathode electrode on the light emitting layer and including a portion in contact with the bank member. The bank member includes a first bank layer, and a second bank layer on the first bank layer, including a metal material different from that of the first bank layer, and including a tip portion protruding than the first bank layer at a sidewall of the opening, and a lateral side of the inorganic insulating layer defining a pattern opening exposing each anode electrode and an end portion of the tip portion of the second bank layer are aligned to each other.

19 Claims, 21 Drawing Sheets

DISPLAY DEVICE AND METHOD OF FABRICATING THE SAME

CROSS-REFERENCE TO RELATED APPLICATION(S)

This application claims priority to and benefits of Korean Patent Application No. 10-2023-0058450 under 35 U.S.C. § 119, filed on May 4, 2023, in the Korean Intellectual Property Office, the entire contents of which are incorporated herein by reference.

BACKGROUND

1. Technical Field

Embodiments relate to a display device and a method of fabricating the display device.

2. Description of the Related Art

With the advance of information-oriented society, more demands are placed on display devices for displaying images in various ways. For example, display devices are implemented in various electronic devices such as smartphones, digital cameras, laptop computers, navigation devices, and smart televisions. The display device includes a flat panel display device such as a liquid crystal display device, a field emission display device, and an organic light emitting display device. Among the flat panel display devices, in the light emitting display device, since each of pixels of a display panel includes a light emitting element capable of emitting light by itself, an image can be displayed without a backlight unit providing light to the display panel.

SUMMARY

Embodiments provide a display device capable of forming separate light emitting elements in each emission area without a mask process, and a method of fabricating the display device capable of simplifying a manufacturing process of the display device.

In the method of fabricating the display device according to an embodiment, since a bank member and an inorganic insulating layer are etched in the same etching process to form a pattern opening, a manufacturing process may be simplified.

In the display device according to an embodiment, an anode electrode and a lower layer of the bank member may overlap each other, so that a tip portion formed in an upper layer of the bank member may be prevented from sagging.

However, effects according to the embodiments are not limited to those examples above and various other effects are incorporated herein. Further, embodiments are not limited to those set forth herein. The above and other embodiments will become more apparent to one of ordinary skill in the art to which the disclosure pertains by referencing the detailed description given below.

According to an embodiment, a display device may include a plurality of anode electrodes spaced apart from each other on a substrate, an inorganic insulating layer disposed on the substrate and the plurality of anode electrodes and exposing a part of each of the plurality of anode electrodes, a bank member disposed on the inorganic insulating layer and including an opening overlapping the plurality of anode electrodes, a light emitting layer disposed on each of the plurality of anode electrodes and including at least a portion disposed on the inorganic insulating layer, and a cathode electrode disposed on the light emitting layer and including at least a portion in contact with the bank member, wherein the bank member may include a first bank layer, and a second bank layer disposed on the first bank layer, including a metal material different from that of the first bank layer, and including a tip portion protruding than the first bank layer at a sidewall of the opening of the bank member, and a lateral side of the inorganic insulating layer defining a pattern opening exposing each of the plurality of anode electrodes and an end portion of the tip portion of the second bank layer are substantially aligned to each other.

The end portion of the tip portion of the second bank layer and the lateral side of the inorganic insulating layer may be aligned along a same virtual line extending in a direction perpendicular to an upper surface of the substrate.

A first angle between a lower surface and the lateral side of the inorganic insulating layer may be smaller than a second angle between a lower surface and a lateral side of the tip portion of the second bank layer.

The lateral side of the tip portion of the second bank layer may extend in a direction perpendicular to an upper surface of the substrate.

The lateral side of the tip portion of the second bank layer and the lateral side of the inorganic insulating layer may be inclined from a direction perpendicular to an upper surface of the substrate.

At least a part of each of the plurality of anode electrodes may overlap the first bank layer.

Each of the plurality of anode electrodes may have an outer portion which overlaps the first bank layer and does not overlap the pattern opening of the inorganic insulating layer.

A diameter of the opening of the first bank layer may be smaller than a diameter of each of the plurality of anode electrodes.

A part of the inorganic insulating layer may be spaced apart from an upper surface of each of the plurality of anode electrodes, the display device may further include a residual pattern layer disposed between the inorganic insulating layer and the upper surface of each of the plurality of anode electrodes.

The inorganic insulating layer may cover a side surface of each of the plurality of anode electrodes.

The first bank layer may include aluminum (Al) or molybdenum (Mo), and the second bank layer may include titanium (Ti).

A part of the light emitting layer may be directly disposed on a side surface of the first bank layer, and the cathode electrode may cover the light emitting layer and a part of the cathode electrode may be disposed directly on the side surface of the first bank layer.

The light emitting layer and the cathode electrode may be spaced apart from the second bank layer.

The display device may further include an organic pattern layer disposed on the second bank layer, the organic pattern layer and the light emitting layer including a same material, and an electrode pattern layer disposed on the organic pattern layer, the electrode pattern layer and the cathode electrode including a same material.

According to an embodiment, a method of fabricating a display device, may include forming a plurality of anode electrodes spaced apart from each other on a substrate, a sacrificial layer disposed on the plurality of anode electrodes, an inorganic insulating layer disposed on the substrate and the sacrificial layer, and a first bank material layer and a second bank material layer disposed on the inorganic insulating layer, a first etching step of etching the first bank material layer, the second bank material layer, and the inorganic insulating layer to form a first hole exposing an upper surface of the sacrificial layer, a second etching step of further etching the first bank material layer to remove a part of the sacrificial layer exposed by the first hole, and forming a light emitting layer disposed on each of the plurality of anode electrodes and a cathode electrode disposed on the light emitting layer in an opening formed by etching the first hole in the second etching step, and forming a first inorganic layer on the cathode electrode and the second bank material layer, wherein in the second etching step, the second bank material layer forms a tip portion protruding than a sidewall of the first bank material layer, and a lateral side of the inorganic insulating layer defining a pattern opening exposing the plurality of anode electrodes and an end portion of the tip portion of the second bank material layer are substantially aligned to each other.

A diameter of each of the plurality of anode electrodes may be greater than a diameter of the opening of the first bank material layer formed in the second etching step, and at least a part of each of the plurality of anode electrodes, which does not overlap the pattern opening of the inorganic insulating layer, may overlap the first bank material layer.

In the second etching step, the inorganic insulating layer may be partially etched, and a first angle between a lower surface and the lateral side of the inorganic insulating layer may be smaller than a second angle between a lower surface and a lateral side of the tip portion of the second bank material layer.

The first etching step may be performed in a direction perpendicular to an upper surface of the substrate, and at an inner sidewall of the first hole, sidewalls of the second bank material layer and the inorganic insulating layer may be formed in a direction perpendicular to the upper surface of the substrate.

The first etching step may be performed in a direction inclined from a direction perpendicular to an upper surface of the substrate, and at an inner sidewall of the first hole, sidewalls of the second bank material layer and the inorganic insulating layer may be formed to be inclined.

A part of the light emitting layer and the cathode electrode may be in direct contact with the first bank material layer on a sidewall in the opening.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
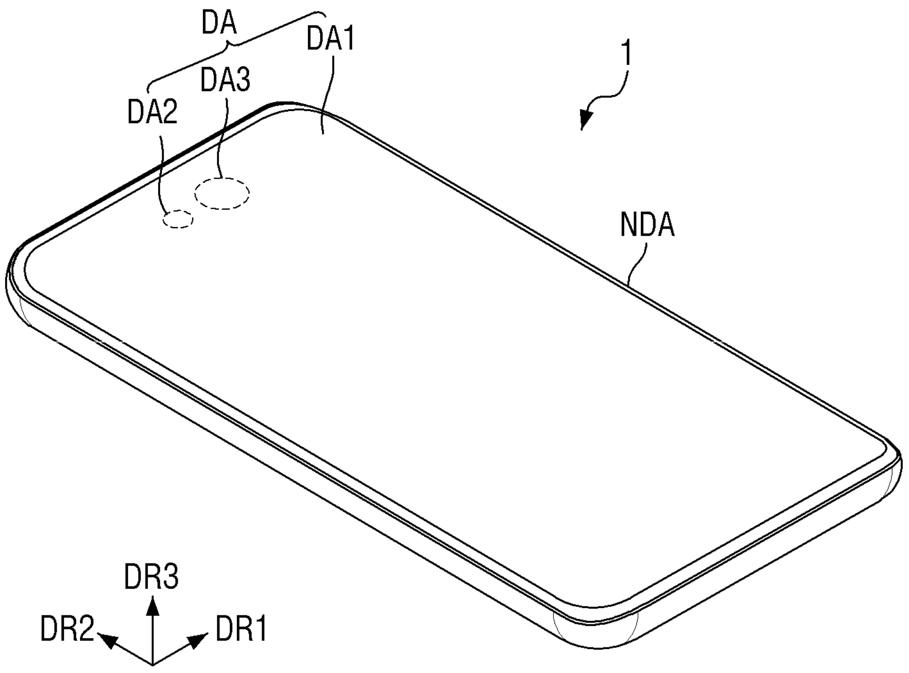
FIG. 1 is a schematic perspective view of an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

FIG. 1 is a schematic perspective view of an electronic device according to an embodiment.

Referring to FIG. 1, an electronic device 1 may display a moving image or a still image. The electronic device 1 may refer to any electronic device including a display screen. Examples of the electronic device 1 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

Figure 2:
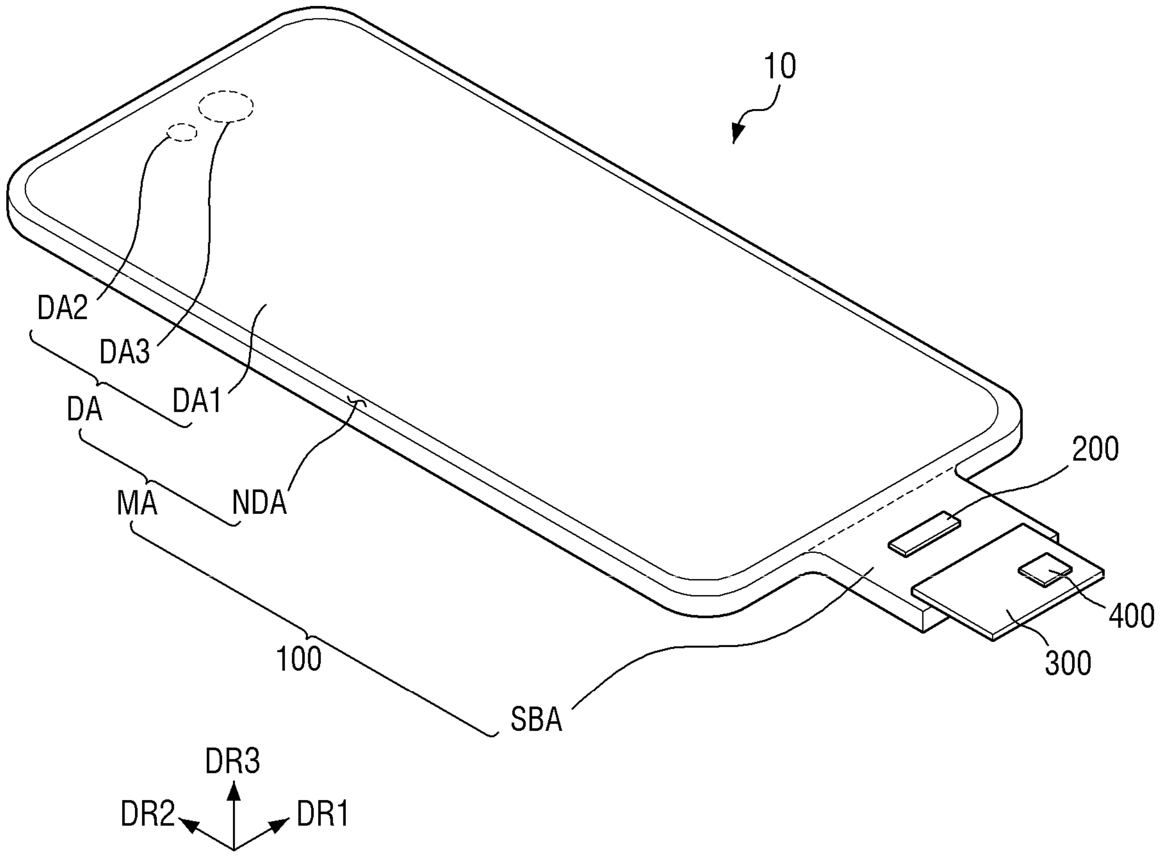
FIG. 2 is a schematic perspective view illustrating a display device included in an electronic device according to an embodiment.

The electronic device 1 may include a display device 10 in FIG. 2 including a display screen. Examples of the display device may include an inorganic light emitting diode display device, an organic light emitting display device, a quantum dot light emitting display device, a plasma display device and a field emission display device. In the following description, a case where an organic light emitting diode display device is applied as a display device will be described, but embodiments are not limited thereto, and other display devices may be applied within the same scope of technical spirit.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (e.g., vertices), other polygonal shapes and a circular shape. The shape of a display area DA of the electronic device 1 may also be similar to the overall shape of the electronic device 1. FIG. 1 illustrates the electronic device 1 having a rectangular shape elongated in a second direction DR2.

The electronic device 1 may include the display area DA and a non-display area NDA. The display area DA may be an area where an image is displayed, and the non-display area NDA may be an area where an image is not displayed. The display area DA may also be referred to as an active region, and the non-display area NDA may also be referred to as a non-active region. The display area DA may substantially occupy the center portion of the electronic device 1.

The display area DA may include a first display area DA1, a second display area DA2, and a third display area DA3. The second display area DA2 and the third display area DA3 may be areas in which components for adding various functions to the electronic device 1 are disposed, and the second display area DA2 and the third display area DA3 may correspond to (or overlap) a component area.

FIG. 2 is a schematic perspective view illustrating a display device included in an electronic device according to an embodiment.

Referring to FIG. 2, the electronic device 1 according to an embodiment may include a display device 10. The display device 10 may include a screen displayed by the electronic device 1. The display device 10 may have a planar shape similar to the shape of the electronic device 1. For example, the display device 10 may have a shape similar to a rectangular shape having a short side in the first direction DR1 and a long side in the second direction DR2. The edge area where the short side in the first direction DR1 and the long side in the second direction DR2 meet may be rounded to have a curvature. However, embodiments are not limited thereto, and the edge area may be formed at a right angle. The planar shape of the display device 10 is not limited to a quadrilateral shape, and may be formed in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed around the display area DA. The display area DA may include the first display area DA1, the second display area DA2, and the third display area DA3. The display area DA may emit light from emission areas or opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but embodiments are not limited thereto.

The non-display area NDA may be an area outside the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may be a region extending from a side of the main region MA. The sub-region SBA may include a flexible material which is bendable, foldable, or rollable. For example, in case that the sub-region SBA is bent, the sub-region SBA may overlap the main region MA in a thickness direction (third direction DR3). The sub-region SBA may include the display driver 200 and a pad portion connected (e.g., electrically connected) to the circuit board 300. In another example, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction by bending of the sub-region SBA. For another example, the display driver 200 may be mounted on the circuit board 300.

The circuit board 300 may be attached to the pad portion of the display panel 100 by using an anisotropic conductive film (ACF). Lead lines of the circuit board 300 may be connected (e.g., electrically connected) to a pad portion of the display panel 100. The circuit board 300 may be a flexible printed circuit board, a printed circuit board, or a flexible film such as a chip on film.

A touch driver 400 may be mounted on the circuit board 300. The touch driver 400 may be connected (e.g., electrically connected) to a touch sensing unit of the display panel 100. The touch driver 400 may supply a touch driving signal to touch electrodes of the touch sensing unit and may sense an amount of change in capacitance between the touch electrodes. For example, the touch driving signal may be a pulse signal having a certain frequency. The touch driver 400 may calculate whether an input is made and input coordinates based on an amount of change in capacitance between the touch electrodes. The touch driver 400 may be formed of an integrated circuit (IC).

Figure 3:
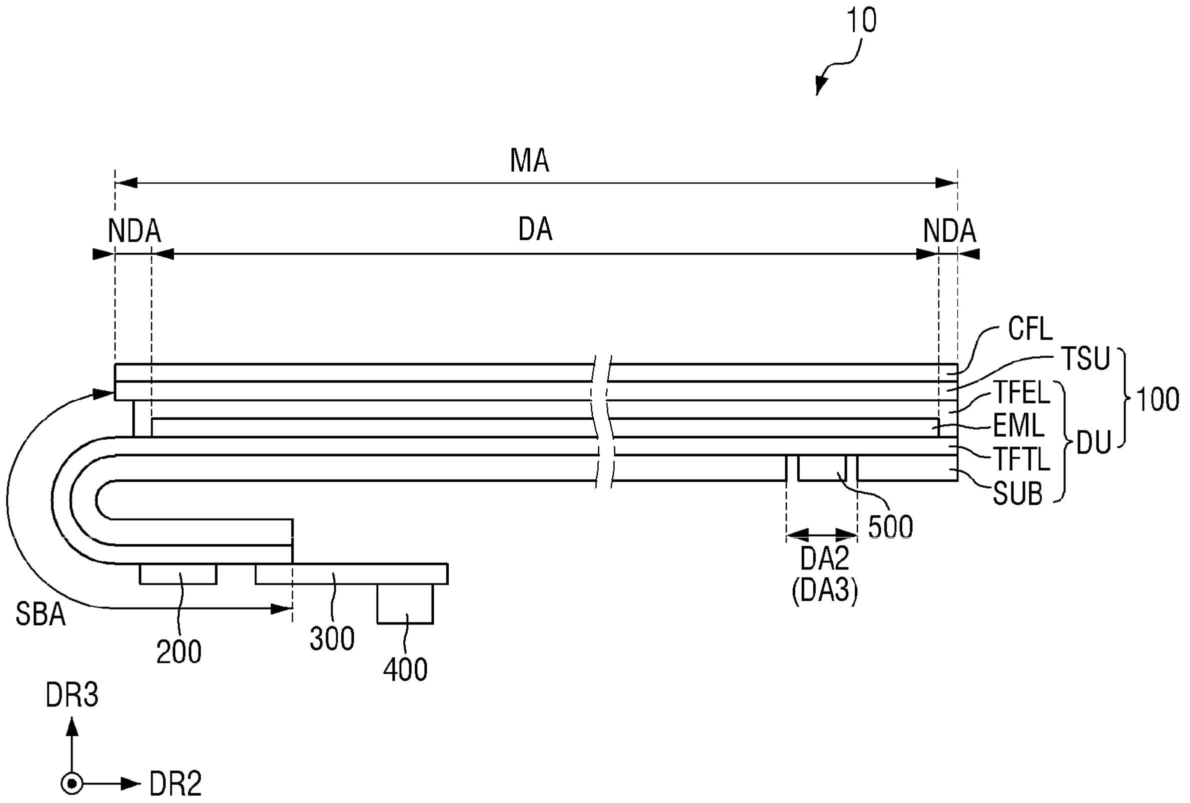
FIG. 3 is a schematic cross-sectional view of the display device of FIG. 2 viewed from the side.

FIG. 3 is a schematic cross-sectional view of the display device of FIG. 2 viewed from the side.

Referring to FIG. 3, the display panel 100 may include a display layer DU, a touch sensing layer TSU, and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate which is bendable, foldable, or rollable. For example, the substrate SUB may include a polymer resin such as polyimide (PI), but embodiments are not limited thereto. In another example, the substrate SUB may include a glass material or a metal material.

The thin film transistor layer TFTL may be disposed on the substrate SUB. The thin film transistor layer TFTL may include thin film transistors forming a pixel circuit of pixels. The thin film transistor layer TFTL may further include gate lines, data lines, power lines, gate control lines, fan-out lines that connect the display driver 200 to the data lines, and lead lines that connect the display driver 200 to the pad portion. Each of the thin film transistors may include a semiconductor region, a source electrode, a drain electrode, and a gate electrode. For example, in case that the gate driver is formed on a side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include light emitting elements each including a first electrode, a second electrode, and a light emitting layer to emit light, and a pixel defining layer defining pixels. The light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In another example, the light emitting elements may include a quantum dot light emitting diode including a quantum dot light emitting layer, an inorganic light emitting diode including an inorganic semiconductor, or a micro light emitting diode.

The display device 10 according to an embodiment may include color filters CF (e.g., CF1, CF2, and CF3) (see FIGS. 5 and 6) disposed on the light emitting elements of the light emitting element layer EML. Each of the color filters may selectively transmit light of a specific wavelength and may block or absorb light of a different wavelength. The color filters may absorb a part of light coming from the outside of the display device 10 to reduce reflected light due to external light. Accordingly, the color filter may prevent color distortion caused by reflection of the external light. Since the color filters are disposed on the light emitting elements, the display device 10 may not require a separate substrate for the color filter. Accordingly, the thickness of the display device 10 may be relatively small.

The thin film encapsulation layer TFEL may cover the top surface (or upper surface) and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the thin encapsulation layer TFEL. The touch sensing layer TSU may include touch electrodes for sensing a user's touch in a capacitive manner, and touch lines connecting the touch electrodes to the touch driver 400. For example, the touch sensing layer TSU may sense the user's touch by using a mutual capacitance method or a self-capacitance method.

In another example, the touch sensing layer TSU may be disposed on a separate substrate disposed on the display layer DU. For example, the substrate supporting the touch sensing layer TSU may be a base member that encapsulates the display layer DU.

The touch electrodes of the touch sensing layer TSU may be disposed in a touch sensor area overlapping the display area DA. The touch lines of the touch sensing layer TSU may be disposed in a touch peripheral area that overlaps the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and visible light bands. For example, the optical device 500 may be an optical sensor that detects light incident on the display device 10 such as a proximity sensor, an illuminance sensor, and a camera sensor or an image sensor.

The color filter layer CFL may be disposed on the thin film encapsulation layer TFEL. The color filter layer CFL may include color filters corresponding to the emission areas, respectively. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

Since the color filter layer CFL is directly disposed on the thin film encapsulation layer TFEL, the display device 10 may not require a separate substrate for the color filter layer CFL. Accordingly, the thickness of the display device 10 may be relatively small.

Figure 4:
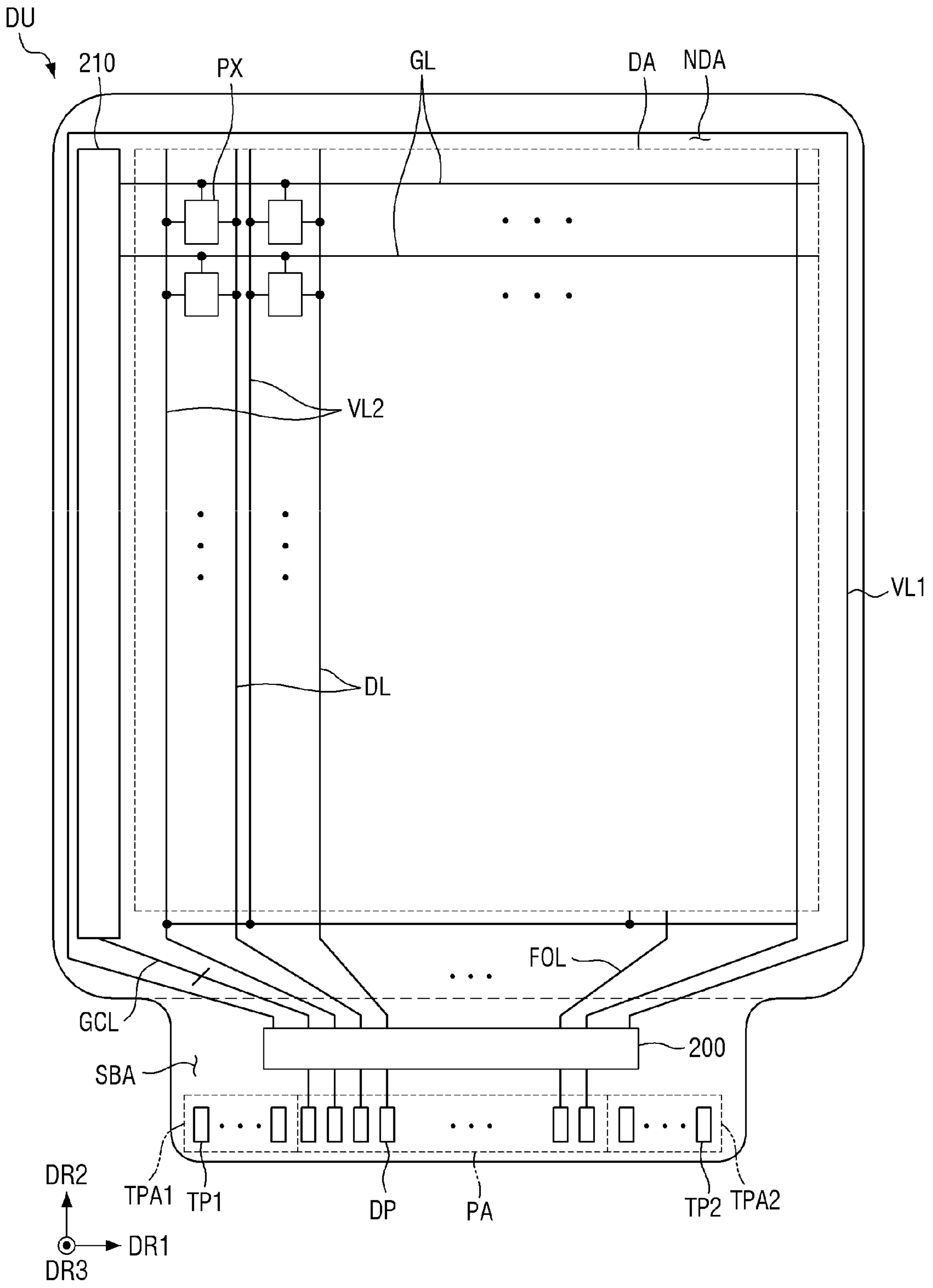
FIG. 4 is a schematic plan view illustrating a display layer of a display device according to an embodiment.

FIG. 4 is a schematic plan view illustrating a display layer of a display device according to an embodiment.

Referring to FIG. 4, the display layer DU may include the display area DA and the non-display area NDA.

The display area DA may be disposed at the center portion of the display panel 100. Pixels PX, gate lines GL, data lines DL, and some (e.g., a second power line VL2) of power lines may be disposed in the display area DA. Each of the pixels PX may be defined as a minimum unit that emits light.

The gate lines GL may supply the gate signals received from the gate driver 210 to the pixels PX. The gate lines GL may extend in the first direction DR1 and may be spaced apart from each other in the second direction DR2 intersecting the first direction DR1.

The data lines DL may supply the data voltages received from the display driver 200 to the pixels PX. The data lines DL may extend in the second direction DR2 and may be spaced apart from each other in the first direction DR1.

Among the power lines, the second power line VL2 may supply the power voltage received from the display driver 200 to the pixels PX. For example, the power voltage may be at least one of a driving voltage, an initialization voltage, or a reference voltage. The second power lines VL2 may extend in the second direction DR2 and may be spaced apart from each other in the first direction DR1.

The non-display area NDA may surround the display area DA. In the non-display area NDA, some of the plurality of power lines (e.g., a first power line VL1), the gate driver 210, fan-out lines FOL, and gate control lines GCL may be disposed. The gate driver 210 may generate gate signals based on the gate control signal, and may sequentially supply the gate signals to the gate lines GL according to a set order.

The fan-out lines FOL may extend from the display driver 200 to the display area DA. The fan-out lines FOL may supply the data voltage received from the display driver 200 to the data lines DL.

The gate control line GCL may extend from the display driver 200 to the gate driver 210. The gate control line GCL may supply the gate control signal received from the display driver 200 to the gate driver 210. In the drawing, it is illustrated that the gate driver 210 is disposed only in the non-display area NDA disposed on the left side of the display area DA, but embodiments are not limited thereto. In some embodiments, the display device 10 may include gate drivers 210 respectively disposed on the left side and the right side of the display area DA.

Among the plurality of power lines, the first power line VL1 may surround the display area DA and be disposed in the non-display area NDA. The first power line VL1 may supply the power voltage received from the display driver 200 to the pixels PX. For example, the power voltage may be a low potential power voltage. The first power line VL1 may be connected (e.g., electrically connected) to the display driver 200 in the non-display area NDA disposed below the display area DA, and may surround the display area DA by including a part extending in the first direction DR1 and the second direction DR2. The first power line VL1 may be connected (e.g., electrically connected) to a bank member (or bank structure) BNS (see FIG. 6) to be described later at the left and right outer portions of the display layer DU. The first power line VL1 may be connected (e.g., electrically connected) to the pixels PX of the display area DA through the bank member BNS.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the pixels PX, and the luminance of the pixels PX may be controlled. The display driver 200 may supply the gate control signal to the gate driver 210 through the gate control line GCL.

The pad area PA, the first touch pad area TPA1, and the second touch pad area TPA2 may be disposed at the edge area of the sub-region SBA. The pad area PA, the first touch pad area TPA1, and the second touch pad area TPA2 may be connected (e.g., electrically connected) to the circuit board 300 by using a material such as self assembly anisotropic conductive paste (SAP) or an anisotropic conductive film.

The pad area PA may include display pad portions DP. The display pad portions DP may be connected (e.g., electrically connected) to a graphic system through the circuit board 300. The display pad portions DP may be connected (e.g., electrically connected) to the circuit board 300 to receive digital video data, and may supply the digital video data to the display driver 200. For example, the first touch pad area TPA1 may include first touch pads TP1, and the second touch pad area TPA2 may include second touch pads TP2.

Figure 5:
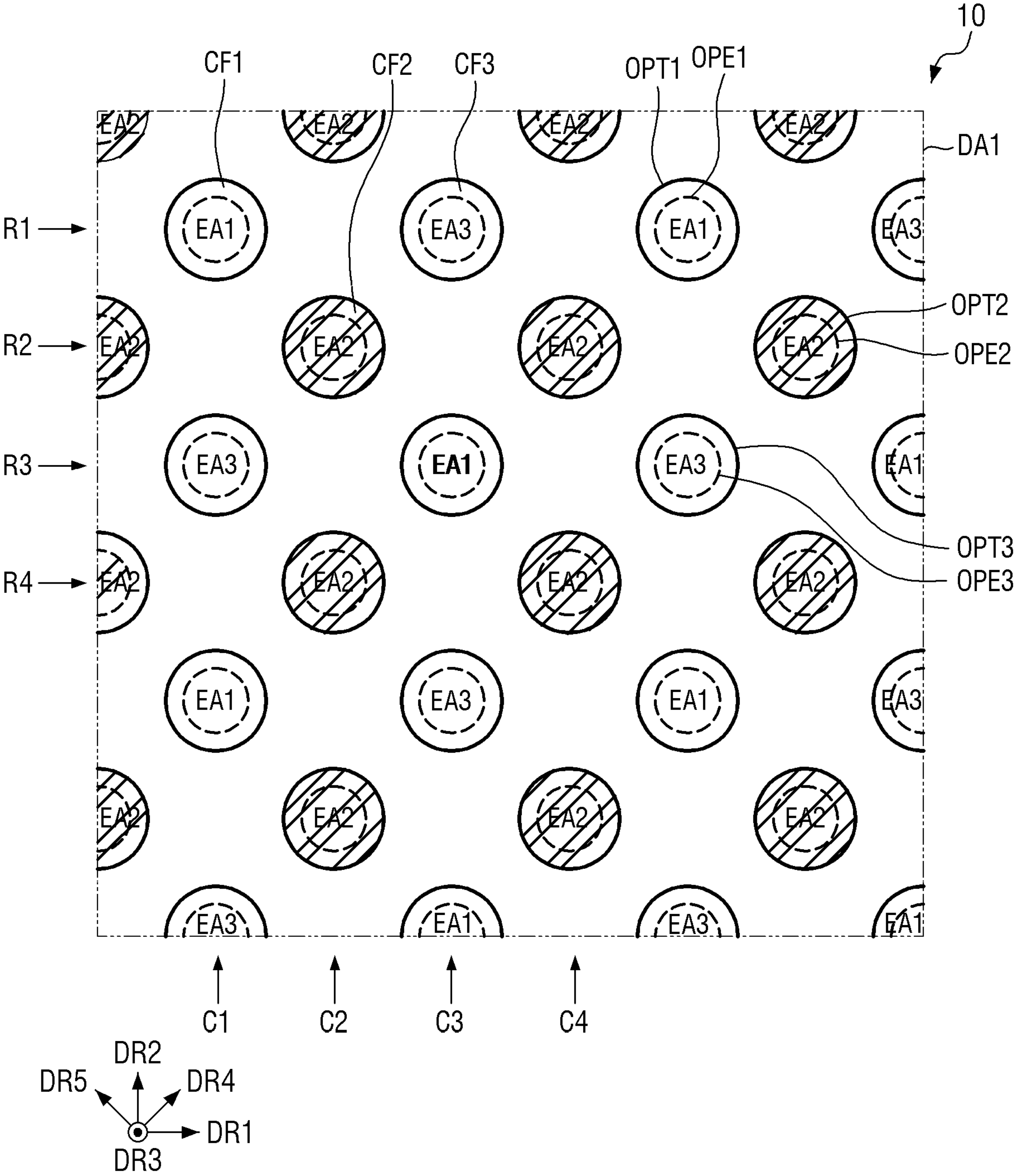
FIG. 5 is a schematic plan view of the disposition of the color filters and the emission areas in the display area of the display device according to an embodiment.

FIG. 5 is a schematic plan view of the disposition of the color filters and the emission areas in the display area of the display device according to an embodiment.

Referring to FIG. 5, the display device 10 may include emission areas EA1, EA2, and EA3 disposed in the display area DA. The display area DA shown in FIG. 5 is the first display area DA1, and the emission areas EA1, EA2, and EA3 may be disposed in the first display area DA1. However, the emission areas EA1, EA2, and EA3 may be disposed also in the second display area DA2 and the third display area DA3 of the display area DA.

The emission areas EA1, EA2, and EA3 may include a first emission area EA1, a second emission area EA2, and a third emission area EA3 emitting light of different colors. The first to third emission areas EA1, EA2, and EA3 may emit red light, green light, or blue light, respectively, and the color of the light emitted from each of the emission areas EA1, EA2 and EA3 may be different according to the type of light emitting elements ED1, ED2, and ED3 (see FIG. 6) disposed on a light emitting element layer EML to be described later. In an embodiment, the first emission area EA1 may emit first light of a red color, the second emission area EA2 may emit second light of a green color, and the third emission area EA3 may emit third light of a blue color. However, embodiments are not limited thereto.

The emission areas EA1, EA2, and EA3 may be arranged in a Pentile™ type, e.g., a diamond Pentile™ type. For example, the first emission area EA1 and the third emission area EA3 may be spaced apart from each other in the first direction DR1, and they may be alternately arranged in the first direction DR1 and the second direction DR2. In the arrangement of the emission areas EA1, EA2, and EA3, the first emission area EA1 and the third emission area EA3 may be alternately arranged in the first direction DR1 in a first row R1 and a third row R3. In a first column C1 and a third column C3, the first emission area EA1 and the third emission area EA3 may be alternately arranged in the second direction DR2.

The second emission area EA2 may be spaced apart from another adjacent second emission area EA2 in the first direction DR1 and the second direction DR2, and may be spaced apart from an adjacent first emission area EA1 and an adjacent third emission area EA3 in a fourth direction DR4 or a fifth direction DR5. The second emission areas EA2 may be repeatedly arranged along the first direction DR1 and the second direction DR2, and the second emission area EA2 and the first emission area EA1, or the second emission area EA2 and the third emission area EA3 may be alternately arranged along the fourth direction DR4 or the fifth direction DR5. In the arrangement of the emission areas EA1, EA2, and EA3, the second emission area EA2 may be repeatedly disposed in the first direction DR1 in a second row R2 and a fourth row R4, and the second emission area EA2 may be repeatedly disposed in the second direction DR2 in a second column C2 and a fourth column C4.

The first to third emission areas EA1, EA2, and EA3 may be respectively defined by openings OPE1, OPE2, and OPE3 formed in the bank member BNS (see FIG. 6) of the light emitting element layer EML which will be described later. For example, the first emission area EA1 may be defined by the first opening OPEL of the pixel defining layer, the second emission area EA2 may be defined by the second opening OPE2 of the pixel defining layer, and the third emission area EA3 may be defined by the third opening OPE3 of the pixel defining layer.

Figure 6:
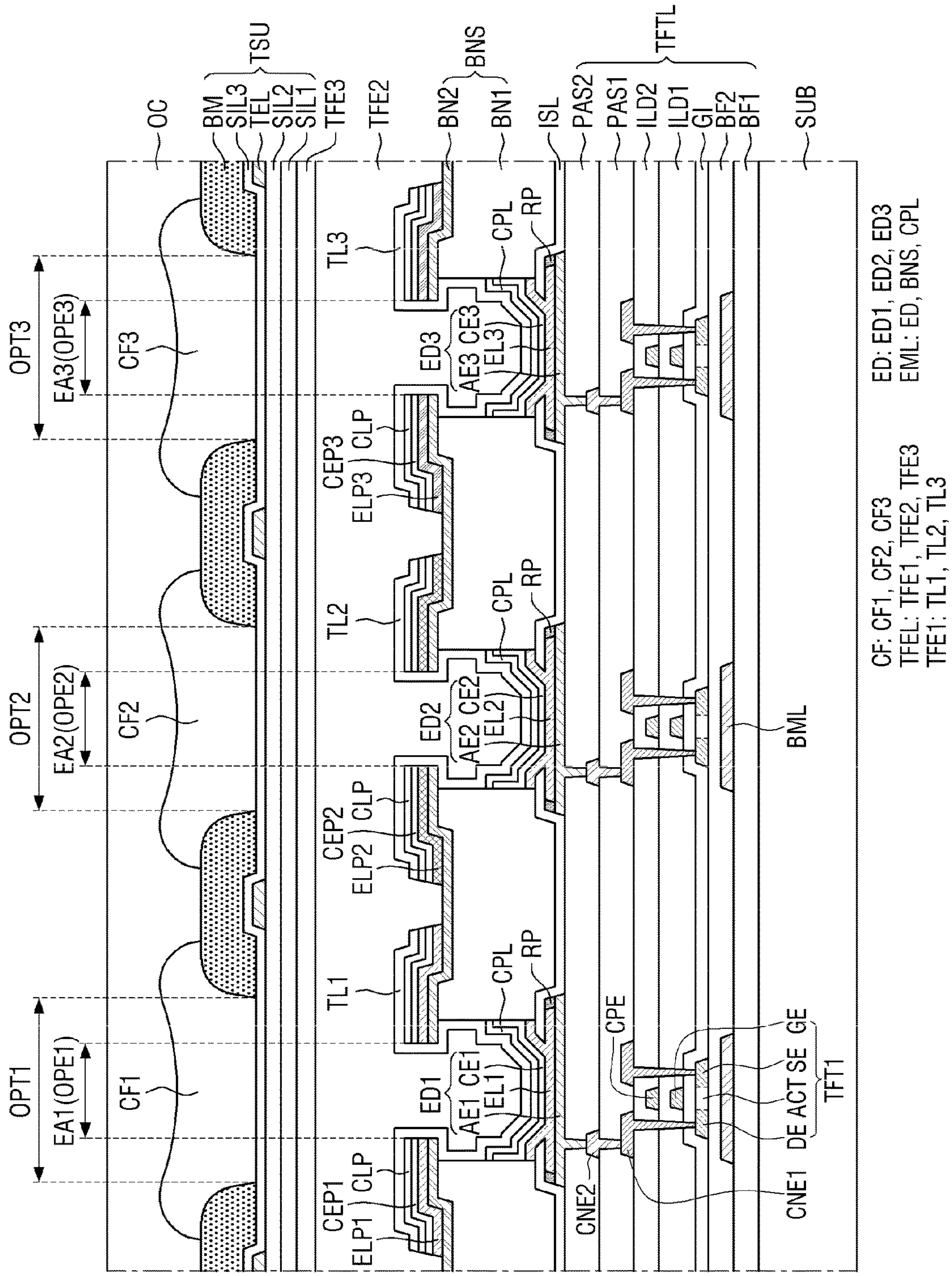
FIG. 6 is a schematic cross-sectional view illustrating a part of a display device according to an embodiment.

The areas (or sizes) of the emission areas EA1, EA2, and EA3 may vary according to the sizes of the openings OPE1, OPE2, and OPE3 of the bank member BNS. The intensity of light emitted from the corresponding emission areas EA1, EA2, and EA3 may vary according to the areas (or sizes) of the emission areas EA1, EA2, and EA3, and the areas (or sizes) of the emission areas EA1, EA2, and EA3 may be adjusted to control the color of the image displayed on the display device 10 or the electronic device 1. In an embodiment, the areas (or sizes) of the first to third emission areas EA1, EA2, and EA3 may be the same as each other. In the embodiment of FIG. 6, the first emission area EA1, the second emission area EA2, and the third emission area EA3 may have the same area or the same diameter.

However, embodiments are not limited thereto. The areas (or sizes) of the emission areas EA1, EA2, and EA3 may be adjusted according to the color of the image required by the display device 10 and the electronic device 1. For example, the areas (or sizes) of the emission areas EA1, EA2, and EA3 may be related to light efficiency and the lifespan of the light emitting element ED (e.g., ED1, ED2, and ED3), and may have a trade-off relation with the reflection by external light. The areas (or sizes) of the emission areas EA1, EA2, and EA3 may be adjusted in consideration of the above factors. For example, in the display device 10, the area (or size) of the third emission area EA3 may be greater than the areas (or sizes) of the first emission area EA1 and the second emission area EA2, and the area (or size) of the first emission area EA1 may be greater than the area (or size) of the second emission area EA2.

In the display device 10 having the arrangement of the emission areas EA1, EA2, and EA3 shown in FIG. 5, one first emission area EA1, two second emission areas EA2, and one third emission area EA3 adjacent to each other may form one pixel group. One pixel group (or single pixel group) may include the emission areas EA1, EA2, and EA3 emitting light of different colors to express a white gray scale. However, embodiments are not limited thereto, and the combination of the emission areas EA1, EA2, and EA3 forming one pixel group may be variously modified according to the arrangement of the emission areas EA1, EA2, and EA3, the color of the light emitted from the emission areas EA1, EA2, and EA3, and the like.

The display device 10 may include the color filters CF (e.g., CF1, CF2, and CF3) disposed on the emission areas EA1, EA2, and EA3. The color filters CF1, CF2, and CF3 may be disposed to correspond to (or to overlap) the emission areas EA1, EA2, and EA3, respectively. For example, the color filters CF1, CF2, and CF3 may be disposed in the emission areas EA1, EA2, and EA3, or opening holes OPT1, OPT2, and OPT3 of a light blocking layer BM disposed to correspond to (or to overlap) the openings OPE1, OPE2, and OPE3, respectively. The opening holes OPT1, OPT2, and OPT3 of the light blocking layer may be formed to overlap the openings OPE1, OPE2, and OPE3, and a light exit area from which the light emitted from the emission areas EA1, EA2, and EA3 is emitted may be formed. The color filters CF1, CF2, and CF3 may have areas greater than those of the openings OPE1, OPE2, and OPE3, respectively, and the color filters CF1, CF2, and CF3 may cover (e.g., completely cover) the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3 disposed to correspond to (or to overlap) the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to (or to overlap) the color of the light emitted from the emission areas EA1, EA2, and EA3. For example, the first color filter CF1 may be a red color filter that overlaps the first emission area EA1 and transmits only the first light of the red color. The second color filter CF2 may be a green color filter that overlaps the second emission area EA2 and transmits only the second light of the green color, and the third color filter CF3 may be a blue color filter that overlaps the third emission area EA3 and transmits only the third light of the blue color.

Similarly to the arrangement of the emission areas EA1, EA2, and EA3, the color filters CF1, CF2, and CF3 may be arranged in a Pentile™ type, e.g., a diamond Pentile™ type. For example, the first color filter CF1 and the third color filter CF3 may be alternately arranged in the first direction DR1 and the second direction DR2. In the arrangement of the color filters CF1, CF2, and CF3, the first color filter CF1 and the third color filter CF3 may be alternately arranged in the first direction DR1 in the first row R1 and the third row R3. In the first column C1 and the third column C3, the first color filter CF1 and the third color filter CF3 may be alternately arranged in the second direction DR2.

The second color filter CF2 and another adjacent second color filter CF2 may be arranged in the first direction DR1 and the second direction DR2, and the second color filter CF2 and an adjacent first color filter CF1 and an adjacent third color filter CF3 may be arranged in the fourth direction DR4 or the fifth direction DR5. The second color filters CF2 may be repeatedly arranged along the first direction DR1 and the second direction DR2, and the second color filter CF2 and the first color filter CF1, or the second color filter CF2 and the third color filter CF3 may be alternately arranged along the fourth direction DR4 or the fifth direction DR5. In the arrangement of the color filters CF1, CF2, and CF3, the second color filter CF2 may be repeatedly disposed in the first direction DR1 in the second row R2 and the fourth row R4, and the second color filter CF2 may be repeatedly disposed in the second direction DR2 in the second column C2 and the fourth column C4.

Figure 7:
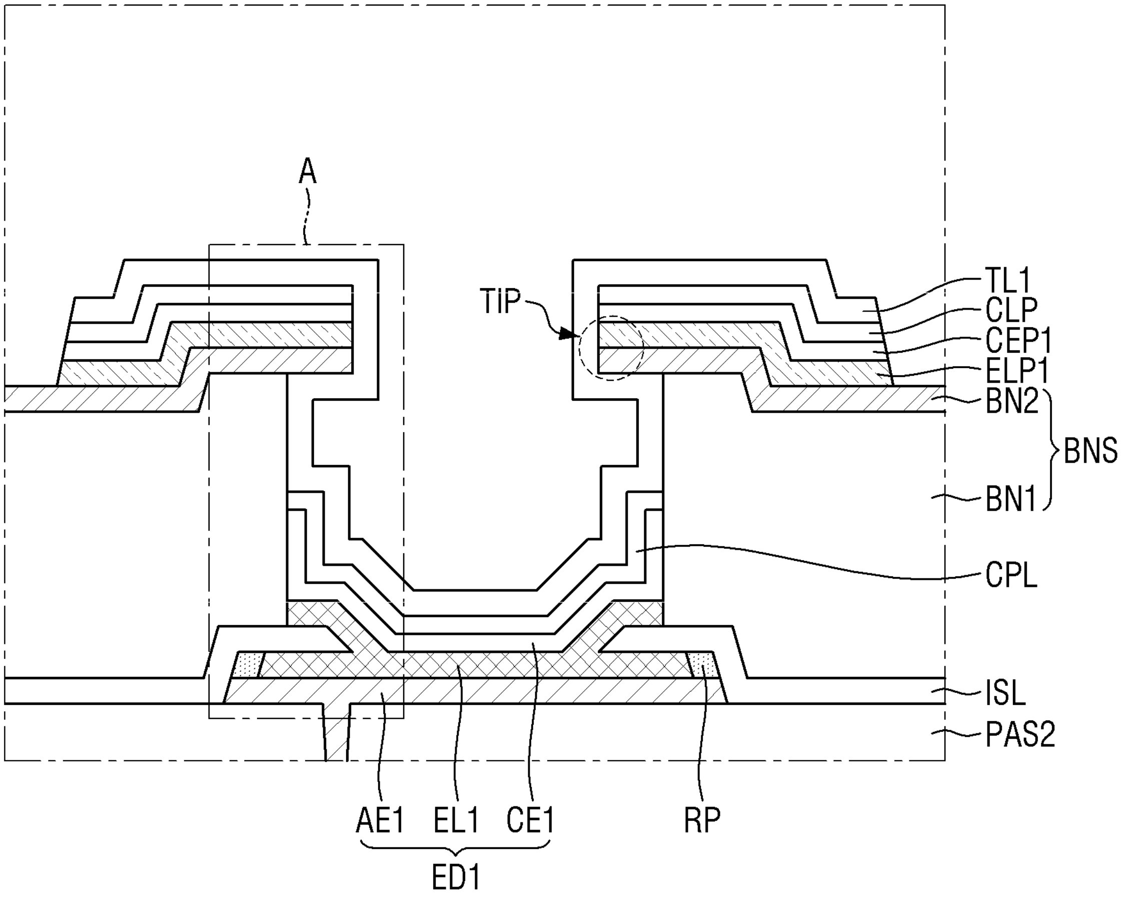
FIG. 7 is an enlarged schematic view illustrating the first emission area of FIG. 6.

FIG. 6 is a schematic cross-sectional view illustrating a part of a display device according to an embodiment. FIG. 7 is an enlarged schematic view illustrating the first emission area of FIG. 6. FIG. 6, which is a partial cross-sectional view of the display device 10, illustrates the cross section of the substrate SUB, the thin film transistor layer TFTL, the light emitting element layer EML, and the thin film encapsulation layer TFEL of the display layer DU, the touch sensing layer TSU, and the color filter layer CFL. FIG. 7 illustrates a first light emitting element ED1 disposed in the first emission area EA1 as part A of FIG. 6 and a part of the bank member BNS adjacent thereto.

Referring to FIGS. 6 and 7 in addition to FIG. 5, the display panel 100 of the display device 10 may include the display layer DU. The display layer DU may include a substrate SUB, a thin film transistor layer TFTL, a light emitting element layer EML, and a thin film encapsulation layer TFEL. The display panel 100 may include the light blocking layer BM disposed on the thin film encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate which is bendable, foldable, and rollable. For example, the substrate SUB may include a polymer resin such as polyimide (PI), but embodiments are not limited thereto. For another example, the substrate SUB may include a glass material or a metal material.

The thin film transistor layer TFTL may include a first buffer layer BF1, a lower metal layer BML, a second buffer layer BF2, a first thin film transistor TFT1, a gate insulating layer GI, a first interlayer insulating layer ILD1, a capacitor electrode CPE, a second interlayer insulating layer ILD2, a first connection electrode CNE1, a first via layer PAS1, a second connection electrode CNE2, and a second via layer PAS2.

The first buffer layer BF1 may be disposed on the substrate SUB. The first buffer layer BF1 may include an inorganic layer capable of preventing penetration of air or moisture. For example, the first buffer layer BF1 may include inorganic layers alternately stacked.

The lower metal layer BML may be disposed on the first buffer layer BF1. For example, the lower metal layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include inorganic layers alternately stacked.

The first thin film transistor TFT1 may be disposed on the second buffer layer BF2, and may constitute a pixel circuit of each of pixels. For example, the first thin film transistor TFT1 may be a driving transistor or a switching transistor of a pixel circuit disposed in the display area DA. The first thin film transistor TFT1 may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF2 to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected (e.g., electrically connected) to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected (e.g., electrically connected) to the contact hole of the first interlayer insulating layer ILD1 and the contact hole of the gate insulating layer GI.

The first connection electrode CNE1 may be disposed on the second interlayer insulating layer ILD2. The first connection electrode CNE1 may connect (e.g., electrically connect) the drain electrode DE of the first thin film transistor TFT1 to the second connection electrode CNE2. The first connection electrode CNE1 may be inserted into (or filled in) a contact hole provided in the second interlayer insulating layer ILD2, the first interlayer insulating layer ILD1, and the gate insulating layer GI to be in contact with the drain electrode DE of the first thin film transistor TFT1.

The first via layer PAS1 may cover the first connection electrode CNE and the second interlayer insulating layer ILD2. The first via layer PAS1 may protect the first thin film transistor TFT1. The first via layer PAS1 may include a contact hole through which the second connection electrode CNE2 passes.

The second connection electrode CNE2 may be disposed on the first via layer PAS1. The second connection electrode CNE2 may connect (e.g., electrically connect) the first connection electrode CNE1 to anode electrodes AE1, AE2, and AE3 of the light emitting element ED (e.g., ED1, ED2, and ED3). The second connection electrode CNE2 may be inserted into (or filled in) a contact hole formed in the first via layer PAS1 to be in contact with the first connection electrode CNE1.

The second via layer PAS2 may cover the second connection electrode CNE2 and the first via layer PAS1. The second via layer PAS2 may include a contact hole through which the anode electrodes AE1, AE2, and AE3 of the light emitting element ED (e.g., ED1, ED2, and ED3) pass.

The light emitting element layer EML may be disposed on the thin film transistor layer TFTL. The light emitting element layer EML may include the light emitting element ED (e.g., ED1, ED2, and ED3), the bank members BNS, and capping layers CPL. The light emitting elements ED1, ED2, and ED3 may include the anode electrodes AE1, AE2, and AE3, light emitting layers EL1, EL2, and EL3, and cathode electrodes CE1, CE2, and CE3.

The display device 10 may include the emission areas EA1, EA2, and EA3 disposed in the display area DA. The emission areas EA1, EA2, and EA3 may include a first emission area EA1, a second emission area EA2, and a third emission area EA3 emitting light of different colors. The first to third emission areas EA1, EA2, and EA3 may emit red light, green light, or blue light, respectively, and the color of the light emitted from each of the emission areas EA1, EA2 and EA3 may be different according to the type of the light emitting element ED (e.g., ED1, ED2, and ED3) disposed on the light emitting element layer EML. In an embodiment, the first emission area EA1 may emit first light of a red color, the second emission area EA2 may emit second light of a green color, and the third emission area EA3 may emit third light of a blue color. However, embodiments are not limited thereto.

The first to third emission areas EA1, EA2, and EA3 may be defined by openings OPE1, OPE2, and OPE3 formed in the bank member BNS of the light emitting element layer EML, respectively. For example, the first emission area EA1 may be defined by the first opening OPEL of the bank member BNS, the second emission area EA2 may be defined by the second opening OPE2 of the bank member BNS, and the third emission area EA3 may be defined by the third opening OPE3 of the bank member BNS.

In an embodiment, the areas (or sizes) of the first to third emission areas EA1, EA2, and EA3 may be the same as each other. For example, in the display device 10, the openings OPE1, OPE2, and OPE3 of the bank members BNS may have the same diameter (or same size), and the first emission area EA1, the second emission area EA2, and the third emission area EA3 may have the same area. However, embodiments are not limited thereto. In the display device 10, the areas (or sizes) of the first to third emission areas EA1, EA2, and EA3 may be different from each other. For example, the areas (or sizes) of the second emission area EA2 may be greater than the areas (or sizes) of the first emission area EA1 and the third emission area EA3, and the area (or size) of the third emission area EA3 may be greater than the area (or size) of the first emission area EA1. The intensity of light emitted from the corresponding emission areas EA1, EA2, and EA3 may vary according to the areas (or sizes) of the emission areas EA1, EA2, and EA3, and the areas (or sizes) of the emission areas EA1, EA2, and EA3 may be adjusted to control the color of the image displayed on the display device 10 or the electronic device 1. Although it is illustrated in the embodiment of FIG. 5 that the emission areas EA1, EA2, and EA3 have the same area, embodiments are not limited thereto. The areas (or sizes) of the emission areas EA1, EA2, and EA3 may be adjusted according to the color of the image required by the display device 10 and the electronic device 1. For example, the areas (or sizes) of the emission areas EA1, EA2, and EA3 may be related to light efficiency and the lifespan of the light emitting element ED (e.g., ED1, ED2, and ED3), and may have a trade-off relation with the reflection by external light. The areas (or sizes) of the emission areas EA1, EA2, and EA3 may be adjusted in consideration of the above factors.

In the display device 10, one first emission area EA1, one second emission area EA2, and one third emission area EA3 disposed adjacent to each other may form one pixel group (or single pixel group). One pixel group may include the emission areas EA1, EA2, and EA3 emitting light of different colors to express a white gray scale. However, embodiments are not limited thereto, and the combination of the emission areas EA1, EA2, and EA3 forming one pixel group may be variously modified according to the arrangement of the emission areas EA1, EA2, and EA3, the color of the light emitted from the emission areas EA1, EA2, and EA3, and the like.

The display device 10 may include the light emitting elements ED1, ED2, and ED3 disposed in the different emission areas EA1, EA2, and EA3. The light emitting elements ED1, ED2, and ED3 may include a first light emitting element ED1 disposed in the first emission area EA1, a second light emitting element ED2 disposed in the second emission area EA2, and a third light emitting element ED3 disposed in the third emission area EA3. The light emitting elements ED1, ED2, and ED3 may include the anode electrodes AE1, AE2, and AE3, the light emitting layers EL1, EL2, and EL3, and the cathode electrodes CE1, CE2, and CE3, respectively, and the light emitting layers EL1, EL2, and EL3 disposed in the different emission areas EA1, EA2, and EA3 may emit lights of different colors according to the materials of the light emitting layers EL1, EL2, and EL3. For example, the first light emitting element ED1 disposed in the first emission area EA1 may emit red light of a first color, the second light emitting element ED2 disposed in the second emission area EA2 may emit green light of a second color, and the third light emitting element ED3 disposed in the third emission area EA3 may emit blue light of a third color. The first to third emission areas EA1, EA2, and EA3 forming a pixel (e.g., single pixel) may respectively include the light emitting elements ED1, ED2, and ED3 emitting lights of different colors to express a white gray scale.

The anode electrodes AE1, AE2, and AE3 may be disposed on the second via layer PAS2. The anode electrodes AE1, AE2, and AE3 may overlap any one of the openings OPE1, OPE2, and OPE3 of the bank member BNS. The anode electrodes AE1, AE2, and AE3 may be connected (e.g., electrically connected) to the drain electrode DE of the first thin film transistor TFT1 through the first and second connection electrodes CNE1 and CNE2.

The anode electrodes AE1, AE2, and AE3 may be disposed on the second via layer PAS2. The anode electrodes AE1, AE2, and AE3 may overlap any one of the openings OPE1, OPE2, and OPE3 of the bank member BNS. The anode electrodes AE1, AE2, and AE3 may be connected (e.g., electrically connected) to the drain electrode DE of the first thin film transistor TFT1 through the first and second connection electrodes CNE1 and CNE2.

The anode electrodes AE1, AE2, and AE3 may be disposed in the emission areas EA1, EA2, and EA3, respectively. The anode electrodes AE1, AE2, and AE3 may include a first anode electrode AE1 disposed in the first emission area EA1, a second anode electrode AE2 disposed in the second emission area EA2, and a third anode electrode AE3 disposed in the third emission area EA3. The first anode electrode AE1, the second anode electrode AE2, and the third anode electrode AE3 may be spaced apart from each other on the second via layer PAS2. The anode electrodes AE1, AE2, and AE3 may be disposed in the different emission areas EA1, EA2, and EA3 to constitute the light emitting elements ED1, ED2, and ED3 emitting lights of different colors, respectively.

The anode electrodes AE1, AE2, and AE3 may include a metal material having high reflectivity. In an embodiment, the anode electrodes AE1, AE2, and AE3 may include metal such as silver (Ag), magnesium (Mg), aluminum (Al), platinum (Pt), palladium (Pd), gold (Au), nickel (Ni), neodymium (Nd), iridium (Ir), and chromium (Cr). The anode electrodes AE1, AE2, and AE3 may include the above-mentioned materials and function as reflective electrodes.

An inorganic insulating layer ISL may be disposed on the second via layer PAS2 and the anode electrodes AE1, AE2, and AE3. The inorganic insulating layer ISL may be disposed on the entire second via layer PAS2, and may partially overlap the anode electrodes AE1, AE2, and AE3 to expose a part of the top surface (or upper surface) of each of the anode electrodes AE1, AE2, and AE3. The inorganic insulating layer ISL may expose the anode electrodes AE1, AE2, and AE3 at the portions overlapping the openings OPE1, OPE2, and OPE3 of the bank member BNS, and the light emitting layers EL1, EL2, and EL3 disposed on the anode electrodes AE1, AE2, and AE3 may be disposed (e.g., directly disposed) on the anode electrodes AE1, AE2, and AE3, respectively. The inorganic insulating layer ISL may include an inorganic insulating material. For example, the inorganic insulating layer ISL may include aluminum oxide, titanium oxide, tantalum oxide, hafnium oxide, zinc oxide, silicon oxide, silicon nitride, and/or silicon oxynitride.

In accordance with an embodiment, the inorganic insulating layer ISL may be disposed on the anode electrodes AE1, AE2, and AE3, and a part thereof may be spaced apart from the top surfaces (or upper surfaces) of the anode electrodes AE1, AE2, and AE3. The inorganic insulating layer ISL may not be in direct contact with the top surfaces (or upper surfaces) of the anode electrodes AE1, AE2, and AE3 with partially overlapping the anode electrodes AE1, AE2, and AE3, and a portion of the light emitting layers EL1, EL2, and EL3 of the light emitting elements ED1, ED2, and ED3 may be disposed between the inorganic insulating layer ISL and the anode electrodes AE1, AE2, and AE3. In the manufacturing process of the display device 10, a sacrificial layer may be disposed on the anode electrodes AE1, AE2, and AE3 before the inorganic insulating layer ISL is formed. The inorganic insulating layer ISL may cover a part of the sacrificial layer, and may be spaced apart from the top surfaces (or upper surfaces) of the anode electrodes AE1, AE2, and AE3 by the removal of the sacrificial layer. The inorganic insulating layer ISL may have a shape protruding from a residual pattern layer RP toward the inside of the openings OPE1, OPE2, and OPE3. In a deposition process of the light emitting layers EL1, EL2, and EL3, the materials forming the light emitting layers EL1, EL2, and EL3 may fill the space between the inorganic insulating layer ISL and the anode electrodes AE1, AE2, and AE3, and the inorganic insulating layer ISL may be partially disposed on the light emitting layers EL1, EL2, and EL3. However, the inorganic insulating layer ISL may be in contact with (e.g., in direct contact with) the side surfaces of the anode electrodes AE1, AE2, and AE3.

The display device 10 may include the bank members BNS disposed on the thin film transistor layer TFTL or the substrate SUB and including the openings OPE1, OPE2, and OPE3. The bank member BNS may have a structure in which bank layers BN1 and BN2 including different materials are sequentially stacked, and may include the openings OPE1, OPE2, and OPE3 respectively forming the emission areas EA1, EA2, and EA3. The light emitting elements ED1, ED2, and ED3 of the display device 10 may overlap the openings OPE1, OPE2, and OPE3 of the bank member BNS.

The bank member BNS may include the first bank layer BN1 disposed on the inorganic insulating layer ISL, and the second bank layer BN2 disposed on the first bank layer BN1.

In accordance with an embodiment, the first bank layer BN1 and the second bank layer BN2 may include different metal materials, and the bank member BNS may include a tip portion TIP in which the second bank layer BN2 protrudes from the first bank layer BN1 toward the openings OPE1, OPE2, and OPE3. In the bank member BNS, the lateral side of the first bank layer BN1 may have a shape recessed inward from the lateral side of the second bank layer BN2. In the bank member BNS, the first bank layer BN1 may be thicker than the second bank layer BN2, and the second bank layer BN2 may be relatively thinner so that the tip portion TIP may be formed in the manufacturing process. Since the second bank layer BN2 has a shape protruding toward the openings OPE1, OPE2, and OPE3 more than the first bank layer BN1, an undercut portion may be formed under the tip portion TIP of the second bank layer BN2 on the inner sidewalls of the openings OPE1, OPE2, and OPE3 of the bank member BNS.

The sidewall shape of the bank member BNS may be a structure formed by a difference in etching rates in an etching process due to different materials of the first bank layer BN1 and the second bank layer BN2. In accordance with an embodiment, the second bank layer BN2 may include a material having an etching rate lower than that of the first bank layer BN1, and the first bank layer BN1 may be further etched in the process of forming the openings OPE1, OPE2, and OPE3 of the bank member BNS to form the undercut portion under the tip portion TIP of the second bank layer BN2. In an embodiment, the first bank layer BN1 may include a metal material having high electrical conductivity, and the second bank layer BN2 may include a metal material having low reflectivity. For example, the first bank layer BN1 may include aluminum (Al) or molybdenum (Mo), and the second bank layer BN2 may include titanium (Ti). The bank member BNS may have a structure in which Mo/Ti or Al/Ti layers are stacked on the inorganic insulating layer ISL, and the tip portion TIP may be formed in the Ti layer of the second bank layer BN2.

The bank member BNS may include the openings OPE1, OPE2, and OPE3 respectively forming the emission areas EA1, EA2, and EA3, and the light blocking layer BM may be disposed thereon. The uppermost layer of the bank member BNS may include a material having low reflectivity to reduce reflection of external light. Further, in the bank member BNS, the first bank layer BN1 may be connected (e.g., electrically connected) to the cathode electrodes CE1, CE2, and CE3 of the different light emitting elements ED1, ED2, and ED3. In the light emitting elements ED1, ED2, and ED3 disposed in the different emission areas EA1, EA2, and EA3, the cathode electrodes CE1, CE2, and CE3 may not be directly connected, but may be connected (e.g., electrically connected) through the first bank layer BN1.

In the manufacturing process of the display device 10, a mask process is required to form the pixel defining layer forming the emission areas EA1, EA2, and EA3 by using an organic material, or to form the light emitting layers EL1, EL2, and EL3 of the light emitting elements ED1, ED2 and ED3 in the respective emission areas EA1, EA2, and EA3. In order to perform the mask process, the display device 10 may require a structure for mounting a mask, or an unnecessarily large area of the non-display area NDA may be required to control variation according to the mask process. In case that a mask process is minimized, an unnecessary component, e.g., the structure for mounting a mask, may be omitted in the display device 10, and the area (or size) of the non-display area NDA for controlling variation may be minimized.

The display device 10 according to an embodiment may include the bank member BNS forming the emission areas EA1, EA2, and EA3, and this may be formed by a deposition process and an etching process instead of the mask process. Further, the bank member BNS may include the first bank layer BN1 and the second bank layer BN2 including different metal materials and have a structure including the tip portion TIP on the inner sidewalls of the openings OPE1, OPE2, and OPE3, so that it is possible to separately form different layers in the different emission areas EA1, EA2, and EA3 even by a deposition process. For example, in case that the light emitting layers EL1, EL2, and EL3 of the light emitting elements ED1, ED2, and ED3 and the cathode electrodes CE1, CE2, and CE3 are formed by a deposition process without using any mask, the deposited materials may be disconnected without being connected between the openings OPE1, OPE2, and OPE3 by the tip portion TIP of the second bank layer BN2 formed on the inner sidewalls of the openings OPE1, OPE2, and OPE3. By a process of forming a material for forming a specific layer on the entire surface of the display device 10 and then removing the layer formed in an undesired region by an etching process, it is possible to individually form different layers in the different emission areas EA1, EA2, and EA3. In the display device 10, the different light emitting elements ED1, ED2, and ED3 may be formed in the different emission areas EA1, EA2, and EA3 by the deposition process and the etching process without using the mask process, and an unnecessary component in the display device 10 may be omitted to minimize the area (or size) of the non-display area NDA.

The light emitting layers EL1, EL2, and EL3 may be disposed on the anode electrodes AE1, AE2, and AE3, respectively. The light emitting layers EL1, EL2, and EL3 may be organic light emitting layers made of an organic material, and may be formed on the anode electrodes AE1, AE2, and AE3, respectively, by the deposition process.

The light emitting layers EL1, EL2, and EL3 may include the first light emitting layer EL1, the second light emitting layer EL2, and the third light emitting layer EL3 disposed in the different emission areas EA1, EA2, and EA3. The first light emitting layer EL1 may be disposed on the first anode electrode AE1 in the first emission area EA1, the second light emitting layer EL2 may be disposed on the second anode electrode AE2 in the second emission area EA2, and the third light emitting layer EL3 may be disposed on the third anode electrode AE3 in the third emission area EA3. The first to third light emitting layers EL1, EL2, and EL3 may be the light emitting layers of the first to third light emitting elements ED1, ED2 and ED3, respectively. The first light emitting layer EL1 may be the light emitting layer emitting red light of the first color, the second light emitting layer EL2 may be the light emitting layer emitting green light of the second color, and the third light emitting layer EL3 may be the light emitting layer emitting blue light of the third color.

In accordance with an embodiment, the light emitting layers EL1, EL2, and EL3 of the light emitting elements ED1, ED2, and ED3 may be partially disposed between the anode electrodes AE1, AE2, and AE3 and the inorganic insulating layer ISL. The inorganic insulating layer ISL may be disposed on the anode electrodes AE1, AE2, and AE3, but may be spaced apart from the top surfaces (or upper surfaces) of the anode electrodes AE1, AE2, and AE3. The deposition process of the light emitting layers EL1, EL2, and EL3 may be performed such that the material of the light emitting layer may be deposited in an inclined direction rather than a direction perpendicular to the top surface (or upper surface) of the substrate SUB. Accordingly, the light emitting layers EL1, EL2, and EL3 may be respectively disposed on the top surfaces (or upper surfaces) of the anode electrodes AE1, AE2, and AE3 exposed through the openings OPE1, OPE2, and OPE3 of the bank member BNS to fill the space between the anode electrodes AE1, AE2, and AE3 and the inorganic insulating layer ISL.

As described above, in the manufacturing process of the display device 10, the sacrificial layer may be disposed between the inorganic insulating layer ISL and the anode electrodes AE1, AE2, and AE3, and the light emitting layers EL1, EL2, and EL3 may be disposed in the region where the sacrificial layer is partially removed. Accordingly, the bottom surface (or lower surface) of the inorganic insulating layer ISL may be spaced apart from the anode electrodes AE1, AE2, and AE3. However, the sacrificial layer may remain as a partial residual pattern layer RP in the region between the inorganic insulating layer ISL and the anode electrodes AE1, AE2, and AE3. The region between the inorganic insulating layer ISL and the anode electrodes AE1, AE2, and AE3 may be filled with the partial residual pattern layer RP and the light emitting layers EL1, EL2, and EL3.

In the light emitting layers EL1, EL2, and EL3, in case that the first thin film transistor TFT1 applies a certain voltage to the anode electrodes AE1, AE2, and AE3 of the light emitting elements ED1, ED2, and ED3, and the cathode electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

In accordance with an embodiment, the light emitting layers EL1, EL2, and EL3 in the emission areas EA1, EA2, and EA3 may also be partially disposed on the side surface of the first bank layer BN1 of the bank member BNS. As the material of the light emitting layer is deposited on the top surface (or upper surface) of the substrate SUB in an inclined direction, the light emitting layers EL1, EL2, and EL3 may also be disposed on the side surface of the first bank layer BN1 of the bank member BNS.

The cathode electrodes CE1, CE2, and CE3 may be disposed on the light emitting layers EL1, EL2, and EL3, respectively. The cathode electrodes CE1, CE2, and CE3 may include a transparent conductive material, so that the light generated in the light emitting layers EL1, EL2, and EL3 may be emitted. The cathode electrodes CE1, CE2, and CE3 may receive a common voltage or a low potential voltage. In case that the anode electrodes AE1, AE2, and AE3 receive the voltage corresponding to a data voltage and the cathode electrodes CE1, CE2, and CE3 receive the low potential voltage, a potential difference may be formed between the anode electrodes AE1, AE2, and AE3 and the cathode electrodes CE1, CE2, and CE3, so that the light emitting layers EL1, EL2, and EL3 may emit light.

The cathode electrodes CE1, CE2, and CE3 may include the first cathode electrode CE1, the second cathode electrode CE2, and the third cathode electrode CE3 disposed in the different emission areas EA1, EA2, and EA3. The first cathode electrode CE1 may be disposed on the first light emitting layer EL1 in the first emission area EA1, the second cathode electrode CE2 may be disposed on the second light emitting layer EL2 in the second emission area EA2, and the third cathode electrode CE3 may be disposed on the third light emitting layer EL3 in the third emission area EA3. In an embodiment, the cathode electrodes CE1, CE2, and CE3 may include a transparent conductive material.

In accordance with an embodiment, the cathode electrodes CE1, CE2, and CE3 of the light emitting elements ED1, ED2, and ED3 may be partially disposed on the side surface of the first bank layer BN1 of the bank member BNS. Similarly to the light emitting layers EL1, EL2, and EL3, the cathode electrodes CE1, CE2, and CE3 may also be formed by a deposition process. The deposition process of the cathode electrodes CE1, CE2, and CE3 may be performed such that the electrode material may be deposited in an inclined direction rather than a direction perpendicular to the top surface (or upper surface) of the substrate SUB. Accordingly, the cathode electrodes CE1, CE2, and CE3 may be disposed on the side surface of the first bank layer BN1 under the tip portion TIP of the second bank layer BN2 of the bank member BNS. The cathode electrodes CE1, CE2, and CE3 may be in contact with (e.g., in direct contact with) the side surface of the first bank layer BN1. The cathode electrodes CE1, CE2, and CE3 of the different light emitting elements ED1, ED2, and ED3 may be in contact with (e.g., in direct contact with) the first bank layer BN1 of the bank member BNS, and the cathode electrodes CE1, CE2, and CE3 may be connected (e.g., electrically connected) to each other. Unlike the anode electrodes AE1, AE2, and AE3, the cathode electrodes CE1, CE2, and CE3 may be implemented in the form of an electrode that is electrically common to all pixels without being divided for pixels.

In accordance with an embodiment, the contact area between the cathode electrodes CE1, CE2, and CE3 and the side surface of the first bank layer BN1 may be greater than the contact area between the light emitting layers EL1, EL2, and EL3 and the side surface of the first bank layer BN1. The cathode electrodes CE1, CE2, and CE3 and the light emitting layers EL1, EL2, and EL3 may be formed such that the materials thereof may be deposited in an inclined direction rather than a direction perpendicular to the top surface (or upper surface) of the substrate SUB, and the position disposed on the side surface of the first bank layer BN1 may vary according to the inclined angle. In an embodiment, the deposition process of the cathode electrodes CE1, CE2, and CE3 may be performed in a more inclined direction than that in the deposition process of the light emitting layers EL1, EL2, and EL3. The cathode electrodes CE1, CE2, and CE3 may be disposed in larger areas on the sidewalls of the openings OPE1, OPE2, and OPE3 as compared to the light emitting layers EL1, EL2, and EL3, or may be located at higher positions on the sidewall of the first bank layer BN1 as compared to the light emitting layers EL1, EL2, and EL3. Since the cathode electrodes CE1, CE2, and CE3 of the different light emitting elements ED1, ED2, and ED3 are connected (e.g., electrically connected) through the first bank layer BN1, it may be advantageous that the larger the contact area with the first bank layer BN1, the lower the resistance.

A capping layer CPL may be disposed on the cathode electrodes CE1, CE2, and CE3. The capping layer CPL may include an inorganic insulating material to cover the light emitting elements ED1, ED2, and ED3. The capping layer CPL may prevent the light emitting elements ED1, ED2, and ED3 from being damaged by external air. In an embodiment, the capping layer CPL may include aluminum oxide, titanium oxide, tantalum oxide, hafnium oxide, zinc oxide, silicon oxide, silicon nitride, and/or silicon oxynitride.

The display device 10 may include pattern layers that correspond to traces of the deposition process and the shape of the bank member BNS. The pattern layers may be formed simultaneously with the capping layer CPL, the light emitting layers EL1, EL2, and EL3 of the light emitting elements ED1, ED2, and ED3 and the cathode electrodes CE1, CE2, and CE3, and may remain on the bank member BNS. Hereinafter, the pattern layers disposed on the bank member BNS will be described.

The display device 10 may include the organic pattern layers ELP1, ELP2, and ELP3 disposed on the bank member BNS. For example, the organic pattern layers ELP1, ELP2, and ELP3 and the light emitting layers EL1, EL2, and EL3 may include the same material. Since the light emitting layers EL1, EL2, and EL3 are formed by a process of depositing a material on the entire surface of the display device 10, the materials forming the light emitting layers EL1, EL2, and EL3 may also be deposited on the bank member BNS in addition to the openings OPE1, OPE2, and OPE3 of the bank member BNS.

For example, the display device 10 may include the organic pattern layers ELP1, ELP2, and ELP3 disposed on the bank member BNS. The organic pattern layers ELP1, ELP2, and ELP3 may include the first organic pattern layer ELP1, the second organic pattern layer ELP2, and the third organic pattern layer ELP3 disposed on the second bank layer BN2 of the bank member BNS.

The first organic pattern layer ELP1 and the first light emitting layer EL1 of the first light emitting element ED1 may include the same material. The second organic pattern layer ELP2 and the second light emitting layer EL2 of the second light emitting element ED2 may include the same material. The third organic pattern layer ELP3 and the third light emitting layer EL3 of the third light emitting element ED3 may include the same material. The organic pattern layers ELP1, ELP2, and ELP3 and the light emitting layers EL1, EL2, and EL3 may be formed in the same process. The organic pattern layers ELP1, ELP2, and ELP3 and the light emitting layers EL1, EL2, and EL3 may include the same material.

The first organic pattern layer ELP1, the second organic pattern layer ELP2, and the third organic pattern layer ELP3 may be disposed (e.g., directly disposed) on the second bank layer BN2 of the bank member BNS. The organic pattern layers ELP1, ELP2, and ELP3 may be formed in the same process as the process of forming the light emitting layers EL1, EL2, and EL3 including the same material as those of the organic pattern layers ELP1, ELP2, and ELP3, and may be disposed near the emission areas EA1, EA2, and EA3 in which the light emitting layers EL1, EL2 and EL3 are disposed, respectively. For example, the first organic pattern layer ELP1 may be disposed on the second bank layer BN2 with surrounding the first opening OPE1 near the first opening OPEL or the first emission area EA1. The second organic pattern layer ELP2 may be disposed on the second bank layer BN2 with surrounding the second opening OPE2 near the second opening OPE2 or the second emission area EA2, and the third organic pattern layer ELP3 may be disposed on the second bank layer BN2 with surrounding the third opening OPE3 near the third opening OPE3 or the third emission area EA3.

The organic pattern layers ELP1, ELP2, and ELP3 may be traces formed because they are disconnected without being connected with the light emitting layers EL1, EL2, and EL3 due to the tip portion TIP of the bank member BNS. The light emitting layers EL1, EL2, and EL3 may be formed in the openings OPE1, OPE2, and OPE3, respectively, and the organic pattern layers ELP1, ELP2, and ELP3 and the light emitting layers EL1, EL2, and EL3 may be disconnected by the tip portion TIP formed on the sidewalls of the openings OPEL, OPE2, and OPE3. Since the light emitting layers EL1, EL2, and EL3 are formed by the deposition process without using any mask, the materials of the light emitting layers EL1, EL2, and EL3 may be formed on the entire bank member BNS. The organic pattern layers ELP1, ELP2, and ELP3 may be formed by patterning them near the emission areas EA1, EA2, and EA3 or the openings OPE1, OPE2, and OPE3.

The display device 10 may include the electrode pattern layers CEP1, CEP2, and CEP3 including the same material as those of the cathode electrodes CE1, CE2, and CE3 and disposed on the bank member BNS. The electrode pattern layers CEP1, CEP2, and CEP3 may include the first electrode pattern layer CEP1, the second electrode pattern layer CEP2, and the third electrode pattern layer CEP3 disposed on the second bank layer BN2 of the bank member BNS.

For example, the first electrode pattern layer CEP1, the second electrode pattern layer CEP2, and the third electrode pattern layer CEP3 may be disposed (e.g., directly disposed) on the first organic pattern layer ELP1, the second organic pattern layer ELP2, and the third organic pattern layer ELP3, respectively. The arrangement relationship of the electrode pattern layers CEP1, CEP2, and CEP3 and the organic pattern layers ELP1, ELP2, and ELP3 may be the same as the arrangement relationship of the light emitting layers EL1, EL2, and EL3 of the light emitting elements ED1, ED2, and ED3 and the cathode electrodes CE1, CE2, and CE3. The electrode pattern layers CEP1, CEP2, and CEP3 may be traces formed because the deposited material is disconnected without being connected with the cathode electrodes CE1, CE2, and CE3 due to the tip portion TIP of the bank member BNS. In the display device 10, the cathode electrodes CE1, CE2, and CE3 may be individually formed in different areas even in a deposition process without using any mask due to the tip portion TIP of the bank member BNS.

The display device 10 may include a capping pattern layer CLP disposed on the bank member BNS. The capping pattern layer CLP may be disposed (e.g., directly disposed) on the first electrode pattern layer CEP1, the second electrode pattern layer CEP2, and the third electrode pattern layer CEP3 disposed on the second bank layer BN2 of the bank member BNS. The arrangement relationship of the capping pattern layer CLP and the electrode pattern layers CEP1, CEP2, and CEP3 may be the same as the arrangement relationship of the cathode electrodes CE1, CE2, and CE3 of the light emitting elements ED1, ED2, and ED3 and the capping layer CPL. The capping pattern layer CLP may be a trace formed because the deposited material is disconnected without being connected with the capping layer CPL due to the tip portion TIP of the bank member BNS.

The organic pattern layers ELP1, ELP2, and ELP3, the electrode pattern layers CEP1, CEP2, and CEP3, and the capping pattern layer CLP may be disposed on the bank member BNS, and may surround the peripheries of the emission areas EA1, EA2, and EA3 or the openings OPE1, OPE2, and OPE3, respectively. The stacked member of the organic pattern layers ELP1, ELP2, and ELP3, the electrode pattern layers CEP1, CEP2, and CEP3, and the capping pattern layer CLP disposed around the emission areas EA1, EA2, and EA3 may be partially etched in the manufacturing process of the display device 10, so that the pattern shape may be changed. Accordingly, a part of the top surface (or upper surface) of the second bank layer BN2 of the bank member BNS may not be covered by the organic pattern layers ELP1, ELP2, and ELP3, the electrode pattern layers CEP1, CEP2, and CEP3, and the capping pattern layer CLP.

The thin film encapsulation layer TFEL may be disposed on the light emitting elements ED1, ED2, and ED3 and the bank member BNS, and may cover the light emitting elements ED1, ED2, and ED3 and the bank member BNS. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment, the thin film encapsulation layer TFEL may include a first encapsulation layer TFE1, a second encapsulation layer TFE2, and a third encapsulation layer TFE3 that are sequentially stacked. The first encapsulation layer TFEL and the third encapsulation layer TFE3 may be inorganic encapsulation layers, and the second encapsulation layer TFE2 disposed between the first encapsulation layer TFEL and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the second encapsulation layer TFE2 may include an acrylic resin, for example, polymethyl methacrylate, polyacrylic acid, or the like. The second encapsulation layer TFE2 may be formed by curing a monomer or applying a polymer.

The first encapsulation layer TFE1 may be disposed on the light emitting elements ED1, ED2, and ED3, the plurality of pattern layers, and the bank member BNS. The first encapsulation layer TFE1 may include the first inorganic layer TL1, the second inorganic layer TL2, and the third inorganic layer TL3 disposed to correspond to (or to overlap) the different emission areas EA1, EA2, and EA3, respectively.

The first inorganic layer TL1, the second inorganic layer TL2, and the third inorganic layer TL3 may include an inorganic insulating material to cover the light emitting elements ED1, ED2, and ED3, respectively. The first inorganic layer TL1, the second inorganic layer TL2, and the third inorganic layer TL3 may prevent the light emitting elements ED1, ED2, and ED3 from being damaged by external air, and may prevent the pattern layers disposed on the bank member BNS from being peeled off during the manufacturing process of the display device 10. In an embodiment, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may cover the organic pattern layers ELP1, ELP2, and ELP3, the electrode pattern layers CEP1, CEP2, and CEP3, and the capping pattern layer CLP. Since the first inorganic layer TL1, the second inorganic layer TL2, and the third inorganic layer TL3 may be formed by a chemical vapor deposition (CVD) method, they may be formed to have a uniform thickness along the stepped portion of the deposited layers. For example, the first inorganic layer TL1, the second inorganic layer TL2, and the third inorganic layer TL3 may form thin films even under the undercut portion by the tip portion TIP of the bank member BNS.

The first inorganic layer TL1 may be disposed on the first light emitting element ED1 and the first electrode pattern layer CEP1. The first inorganic layer TL1 may cover the first light emitting element ED1 and the first opening OPEL along the inner sidewalls thereof, and may also cover the first organic pattern layer ELP1, the first electrode pattern layer CEP1, and the capping pattern layer CLP. However, the first inorganic layer TL1 may not overlap the second opening OPE2 and the third opening OPE3, and may be disposed on (e.g., only on) the first opening OPEL and the bank member BNS adjacent thereto.

The second inorganic layer TL2 may be disposed on the second light emitting element ED2 and the second electrode pattern layer CEP2. The second inorganic layer TL2 may cover the second light emitting element ED2 and the second opening OPE2 along the inner sidewalls thereof, and may also cover the second organic pattern layer ELP2, the second electrode pattern layer CEP2, and the capping pattern layer CLP. However, the second inorganic layer TL2 may not overlap the first opening OPEL and the third opening OPE3, and may be disposed on (e.g., only on) the second opening OPE2 and the bank member BNS adjacent thereto.

The third inorganic layer TL3 may be disposed on the third light emitting element ED3 and the third electrode pattern layer CEP3. The third inorganic layer TL3 may be disposed along the inner sidewalls of the third light emitting element ED3 and the third opening OPE3 to cover them, and may also cover the third organic pattern layer ELP3, the third electrode pattern layer CEP3, and the capping pattern layer CLP. However, the third inorganic layer TL3 may not overlap the first opening OPEL and the second opening OPE2, and may be disposed on (e.g., only on) the third opening OPE3 and the bank member BNS adjacent thereto.

The first inorganic layer TL1 may be formed after the first cathode electrode CE1 is formed, the second inorganic layer TL2 may be formed after the second cathode electrode CE2 is formed, and the third inorganic layer TL3 may be formed after the third cathode electrode CE3 is formed. Accordingly, the first to third inorganic layers TL1, TL2, and TL3 may cover the different electrode pattern layers CEP1, CEP2, and CEP3 and the organic pattern layers ELP1, ELP2, and ELP3, respectively. In plan view, the first inorganic layer TL1, the second inorganic layer TL2, and the third inorganic layer TL3 may have larger areas (or sizes) than those of the openings OPE1, OPE2, and OPE3 of the bank member BNS, respectively. The first inorganic layer TL1, the second inorganic layer TL2, and the third inorganic layer TL3 may be spaced apart from each other on the bank member BNS. Accordingly, a part of the second bank layer BN2 of the bank member BNS may not overlap the inorganic layers TL1, TL2, and TL3, and a part of the top surface (or upper surface) thereof may be exposed without being covered by the inorganic layers TL1, TL2, and TL3. A part of the second bank layer BN2 may be in contact with (e.g., in direct contact with) the second encapsulation layer TFE2 of the thin film encapsulation layer TFEL which will be described later.

The touch sensing layer TSU may be disposed on the thin encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the thin encapsulation layer TFEL. The first touch insulating layer SIL1 may have an insulating function and an optical function. The first touch insulating layer SIL1 may include at least one inorganic layer. In another example, the first touch insulating layer SIL1 may be omitted.

The second touch insulating layer SIL2 may cover the first touch insulating layer SIL1. For example, a touch electrode of another layer may be further disposed on the first touch insulating layer SIL1, and the second touch insulating layer SIL2 may cover the touch electrode TEL. The second touch insulating layer SIL2 may have an insulating function and an optical function. For example, the second touch insulating layer SIL2 may be an inorganic layer including at least one of a silicon nitride layer, a silicon oxynitride layer, a silicon oxide layer, a titanium oxide layer, or an aluminum oxide layer.

A part of the touch electrode TEL may be disposed on the second touch insulating layer SIL2. The touch electrode TEL may not overlap the first to third emission areas EA1, EA2, and EA3. The touch electrode TEL may be formed of a single layer including molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The third touch insulating layer SIL3 may cover the touch electrode TEL and the second touch insulating layer SIL2. The third touch insulating layer SIL3 may have an insulating function and an optical function. The third touch insulating layer SIL3 may be made of the material of the second touch insulating layer SIL2.

The light blocking layer BM may be disposed on the touch sensing layer TSU. The light blocking layer BM may include the opening holes OPT1, OPT2, and OPT3 overlapping the emission areas EA1, EA2, and EA3. For example, the first opening hole OPT1 may overlap the first emission area EA1. The second opening hole OPT2 may overlap the second emission area EA2, and the third opening hole OPT3 may overlap the third emission area EA3. The areas (or sizes) of the opening holes OPT1, OPT2, and OPT3 may be larger than the areas (or sizes) of the emission areas EA1, EA2, and EA3 defined by the bank member BNS, respectively. The opening holes OPT1, OPT2, and OPT3 of the light blocking layer BM may be formed to be larger than the emission areas EA1, EA2, and EA3, so that the light emitted from the emission areas EA1, EA2, and EA3 may be visually recognized by the user not only from the front surface but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but embodiments are not limited thereto. The light blocking layer BM may prevent visible light infiltration and color mixture between the first to third emission areas EA1, EA2, and EA3, which leads to the improvement of color reproducibility of the display device 10.

The display device 10 may include the color filters CF1, CF2, and CF3 disposed on the emission areas EA1, EA2, and EA3. The color filters CF1, CF2, and CF3 may be disposed to correspond to (or to overlap) the emission areas EA1, EA2, and EA3, respectively. For example, the color filters CF1, CF2, and CF3 may be disposed on the light blocking layer BM including the opening holes OPT1, OPT2, and OPT3 disposed to correspond to (or to overlap) the emission areas EA1, EA2, and EA3, respectively. The holes of the light blocking layer may be formed to overlap the emission areas EA1, EA2, and EA3, or the openings of the bank members BNS, and may form a light exit area from which the light emitted from the emission areas EA1, EA2, and EA3 is emitted. The color filters CF1, CF2, and CF3 may have areas larger than those of the holes of the light blocking layer BM, and the color filters CF1, CF2, and CF3 may cover (e.g., completely cover) the light exit area formed by the holes.

The color filters CF1, CF2, and CF3 may include a first color filter CF1, a second color filter CF2, and a third color filter CF3 disposed to correspond to (or to overlap) the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to (or to overlap) the color of the light emitted from the emission areas EA1, EA2, and EA3. For example, the first color filter CF1 may be a red color filter that overlaps the first emission area EA1 and transmits only the first light of the red color. The second color filter CF2 may be a green color filter that overlaps the second emission area EA2 and transmits only the second light of the green color, and the third color filter CF3 may be a blue color filter that overlaps the third emission area EA3 and transmits only the third light of the blue color.

The color filters CF1, CF2, and CF3 may be spaced apart from other adjacent color filters CF1, CF2, and CF3 on the light blocking layer BM. The color filters CF1, CF2, and CF3 may have areas larger than those of the opening holes OPT1, OPT2, and OPT3 of the light blocking layer BM, respectively, with covering the holes, and may have areas enough to be spaced apart from other color filters CF1, CF2, and CF3 on the light blocking layer BM. However, embodiments are not limited thereto. The color filters CF1, CF2, and CF3 may partially overlap other adjacent color filters CF1, CF2, and CF3. The different color filters CF1, CF2, and CF3 may be areas that do not overlap the emission areas EA1, EA2, and EA3, and may overlap each other on the light blocking layer BM to be described later. In the display device 10, the color filters CF1, CF2, and CF3 may overlap each other, so that the intensity of the reflected light by external light may be reduced. Furthermore, the color of the reflected light by the external light may be controlled by adjusting the disposition, shape, and area (or size) of the color filters CF1, CF2, and CF3 in plan view.

The color filters CF1, CF2, and CF3 of the color filter layer CFL may be disposed on the light blocking layer BM. The different color filters CF1, CF2, and CF3 may be disposed to correspond to (or to overlap) the different emission areas EA1, EA2, and EA3 or openings OPE1, OPE2, and OPE3, and the opening holes OPT1, OPT2, and OPT3 of the light blocking layer BM, respectively. For example, the first color filter CF1 may be disposed to correspond to (or to overlap) the first emission area EA1, the second color filter CF2 may be disposed to correspond to (or to overlap) the second emission area EA2, and the third color filter CF3 may be disposed to correspond to (or to overlap) the third emission area EA3. The first color filter CF1 may be disposed in the first opening hole OPT1 of the light blocking layer BM, the second color filter CF2 may be disposed in the second opening hole OPT2 of the light blocking layer BM, and the third color filter CF3 may be disposed in the third opening hole OPT3 of the light blocking layer BM. Each of the color filters CF1, CF2, and CF3 may have a larger area (or size) in plan view than the opening holes OPT1, OPT2, and OPT3 of the light blocking layer BM, and some may be disposed (e.g., directly disposed) on the light blocking layer BM.

An overcoat layer OC may be disposed on the color filters CF1, CF2, and CF3 to planarize the top end portions (or upper end portions) of the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 8:
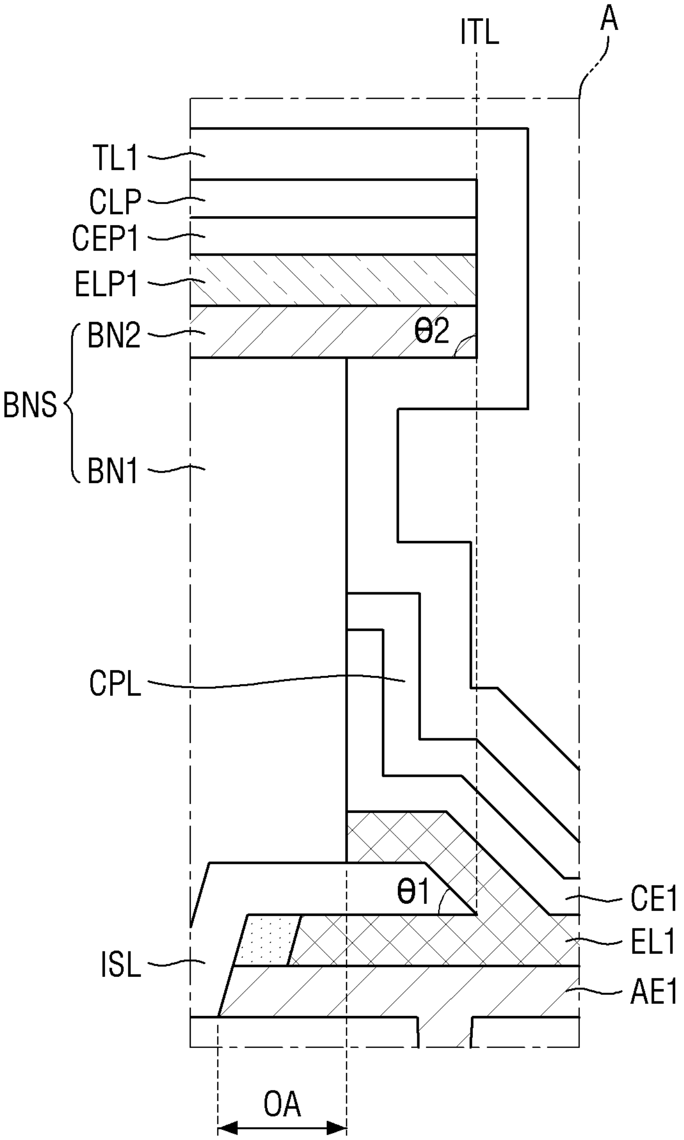
FIG. 8 is an enlarged view of part A of FIG. 7.

FIG. 8 is an enlarged schematic view of part A of FIG. 7. FIG. 8 illustrates an enlarged relative arrangement of the bank member BNS, the inorganic insulating layer ISL, and the anode electrode (e.g., the first anode electrode AE1).

Referring to FIG. 8, in the display device 10 according to an embodiment, in a process of forming the openings OPE1, OPE2, and OPE3 of the bank member BNS, the inorganic insulating layer ISL may also be etched, and an end portion of the tip portion TIP formed in the second bank layer BN2 of the bank member BNS may be formed substantially aligned to an end portion of a pattern opening of the inorganic insulating layer ISL. In the display device 10, the sidewall of the second bank layer BN2 in contact with the openings OPE1, OPE2, and OPE3 of the bank member BNS and the sidewall in contact with the pattern opening of the inorganic insulating layer ISL exposing the anode electrodes AE1, AE2, and AE3 may be disposed on (or aligned along) the same virtual line.

In case that an imaginary line (or virtual line) ITL extending in a direction perpendicular to the top surface (or upper surface) of the substrate SUB is defined from the end portion where the tip portion TIP of the second bank layer BN2 is formed, the end portion in contact with the opening of the inorganic insulating layer ISL may be disposed on the imaginary line ITL. In the manufacturing process of the display device 10, the second bank layer BN2 and the inorganic insulating layer ISL may be etched together in the same etching process. In an opening formed after being etched (or a first hole HOL1 of FIG. 10), the sidewalls of the second bank layer BN2 and the inorganic insulating layer ISL may be substantially aligned to each other. Although the bank member BNS includes a metal material and the inorganic insulating layer ISL includes an insulating material, as they are etched together in the same etching process, the manufacturing process may be shortened.

However, the end portion of the second bank layer BN2 or the sidewall in contact with the openings OPE1, OPE2, and OPE3 and the end portion of the inorganic insulating layer ISL or the sidewall in contact with the pattern opening may be formed substantially aligned to each other, but may have different shapes. For example, the end portion of the second bank layer BN2 may have a sidewall perpendicular to the top surface (or upper surface) of the substrate SUB, and the end portion of the inorganic insulating layer ISL may have a sidewall inclined from the top surface (or upper surface) of the substrate SUB. In an embodiment, in the inorganic insulating layer ISL, a first angle θ1 formed between the bottom surface (or lower surface) and the sidewall at the lateral side or end portion of the pattern opening of the inorganic insulating layer ISL may be smaller than a second angle θ2 formed between the bottom surface (or lower surface) and the sidewall at the end portion of the second bank layer BN2. While the second bank layer BN2 has an almost vertical lateral side at the end portion forming the tip portion TIP, the end portion of the inorganic insulating layer ISL may have a side surface inclined from the bottom surface (or lower surface).

As the second bank layer BN2 has an almost vertical lateral side at the end portion forming the tip portion TIP, in the deposition process performed during the manufacturing process of the display device 10, disconnection between an upper portion of the bank member BNS and a material disposed in the openings OPE1, OPE2, and OPE3 may be smoothly disconnected. As the inorganic insulating layer ISL has a side surface inclined from the bottom surface (or lower surface) at the end portion, the light emitting layers EL1, EL2, and EL3 disposed in the pattern opening of the inorganic insulating layer ISL may be smoothly deposited on the top surface (or upper surface) of the inorganic insulating layer ISL as well as inside the pattern opening of the inorganic insulating layer ISL. Not only the light emitting layers EL1, EL2, and EL3, but also the cathode electrodes CE1, CE2, and CE3 may be formed smoothly without breaking the material even inside the pattern opening of the inorganic insulating layer ISL and on the inorganic insulating layer ISL. The end portion of the inorganic insulating layer ISL may have a gentle slope so that layers disposed thereon may be smoothly formed not only inside the pattern opening but also on the inorganic insulating layer ISL.

The display device 10 may have a shape in which the end portions of the inorganic insulating layer ISL and the second bank layer BN2 relatively protrude from the lower layer. For example, the second bank layer BN2 may have an end portion protruding from the sidewall of the first bank layer BN1, and the inorganic insulating layer ISL may also have a protruding end portion as compared to the residual pattern layer RP.

In the display device 10, the anode electrodes AE1, AE2, and AE3 may overlap the first bank layer BN1 of the bank member BNS. The anode electrodes AE1, AE2, and AE3 may have areas (or sizes) larger than the openings OPE1, OPE2, and OPE3 of the bank member BNS in plan view, and the outer portions thereof may overlap the first bank layer BN1, respectively. The outer portions of the anode electrodes AE1, AE2, and AE3, which do not overlap the pattern opening of the inorganic insulating layer ISL, may overlap the first bank layer BN1. Although FIG. 8 illustrates that the width of an overlapping region OA is substantially the same as the width of the portion where the inorganic insulating layer ISL protrudes from the sidewall of the first bank layer BN1, embodiments are not limited thereto.

The protruding portion of the inorganic insulating layer ISL and the second bank layer BN2 may sag because the protruding portion thereof is not supported by other layers therebelow. In the display device 10, as the anode electrodes AE1, AE2, and AE3 disposed below the first bank layer BN1 overlap the first bank layer BN1, the end portions of the second bank layer BN2 and the inorganic insulating layer ISL protruding than the sidewall of the first bank layer BN1 may be prevented from sagging (or bending).

In the display device 10 according to an embodiment, since the bank member BNS and the inorganic insulating layer ISL are etched in the same etching process to form a pattern opening of the inorganic insulating layer ISL, the manufacturing process may be simplified. For example, since the anode electrodes AE1, AE2, and AE3 overlap the first bank layer BN1, it is possible to prevent the tip portion TIP of the second bank layer BN2 from sagging (or bending) due to the process change.

Hereinafter, a manufacturing process of the display device 10 according to an embodiment will be described with reference to other drawings.

FIGS. 9, 10, 11, 12, 13, 14, 15, 16, and 17 are schematic cross-sectional views sequentially illustrating a display area during a manufacturing process of a display device according to an embodiment.

FIGS. 9, 10, 11, 12, 13, 14, 15, 16, and 17 schematically illustrate a process of forming the light emitting elements ED (e.g., ED1, ED2, and ED3) and the bank member BNS as the light emitting element layer EML of the display device 10. Hereinafter, with respect to the manufacturing process of the display device 10, a description of the formation process of each layer will be omitted, and the formation order of each layer will be described.

Figure 9:
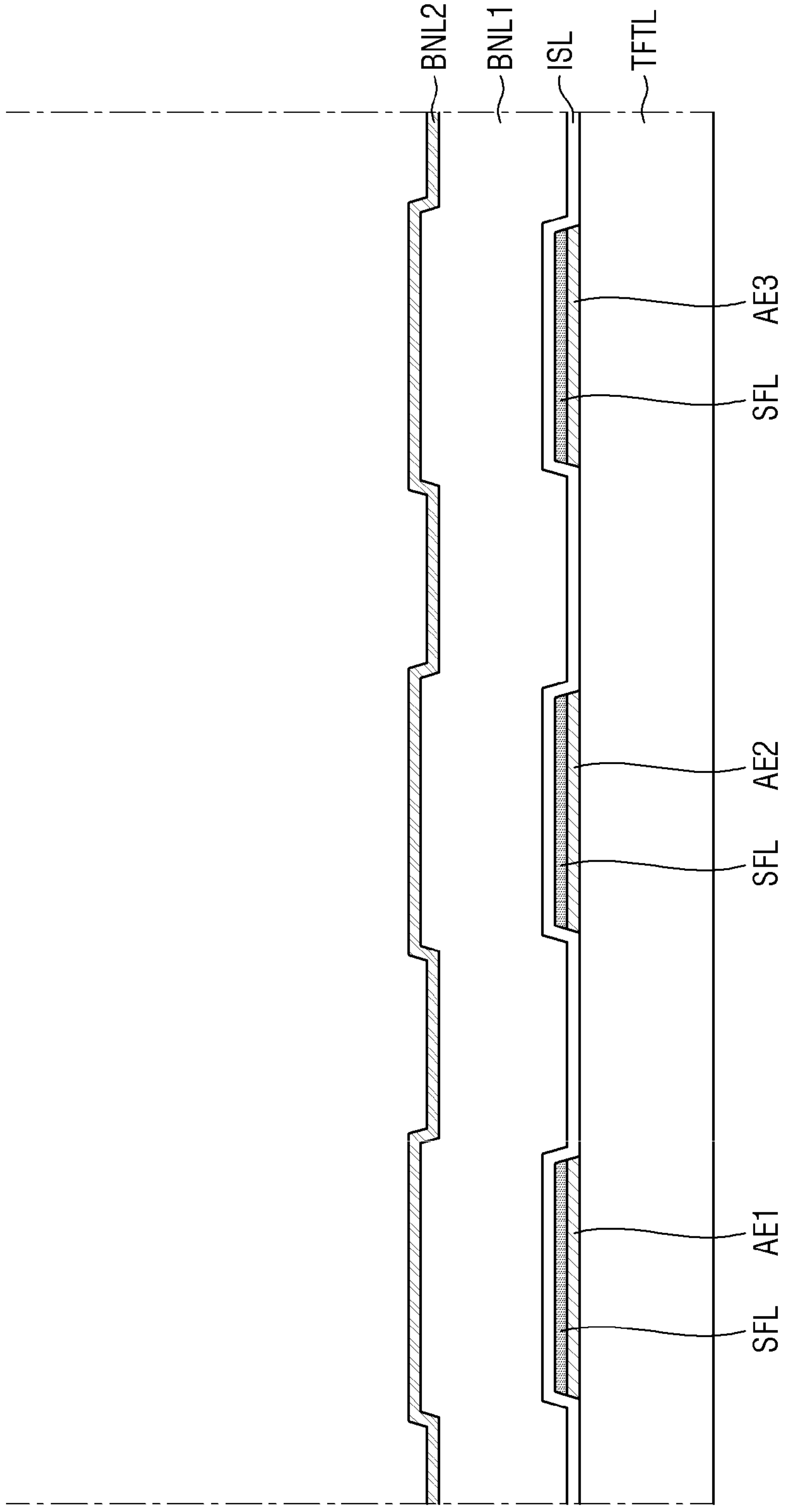
FIGS. 9, 10, 11, 12, 13, 14, 15, 16, and 17 are schematic cross-sectional views sequentially illustrating a display area during a manufacturing process of a display device according to an embodiment.

Referring to FIG. 9, the anode electrodes AE1, AE2, and AE3, the sacrificial layer SFL, the inorganic insulating layer ISL, and the bank material layers BNL1 and BNL2 may be formed on the thin film transistor layer TFTL.

For example, the thin film transistor layer TFTL may be disposed on the substrate SUB, and the structure of the thin film transistor layer TFTL is the same as described above with reference to FIG. 6. A detailed description thereof will be omitted for descriptive convenience.

The anode electrodes AE1, AE2, and AE3 may be spaced apart from each other on the thin film transistor layer TFTL. The anode electrodes AE1, AE2, and AE3 may include the first anode electrode AE1, the second anode electrode AE2, and the third anode electrode AE3 of the different light emitting elements ED1, ED2, and ED3. The first to third anode electrodes AE1, AE2, and AE3 may be spaced apart from each other on the thin film transistor layer TFTL.

The sacrificial layer SFL may be disposed on the anode electrodes AE1, AE2, and AE3. The sacrificial layer SFL may be disposed on the anode electrodes AE1, AE2, and AE3, and then may be partially removed in a subsequent process to form a space in which the light emitting layers EL1, EL2, and EL3 are disposed. The sacrificial layer SFL may prevent the contact between the top surfaces (or upper surfaces) of the anode electrodes AE1, AE2, and AE3 and the inorganic insulating layer ISL, and the sacrificial layer SFL may be removed to form a space between the anode electrodes AE1, AE2, and AE3 and the inorganic insulating layer ISL. In an embodiment, the sacrificial layer SFL may include an oxide semiconductor. For example, the sacrificial layers SFL1, SFL2, and SFL3 may include at least one of indium-gallium-zinc oxide (IGZO), zinc-tin oxide (ZTO), or indium-tin oxide (ITO).

The inorganic insulating layer ISL and the bank material layers BNL1 and BNL2 may be disposed on the sacrificial layer SFL. The inorganic insulating layer ISL may cover (e.g., entirely cover) the sacrificial layer SFL and the thin film transistor layer TFTL, and the bank material layers BNL1 and BNL2 may cover (e.g., entirely cover) the inorganic insulating layer ISL. The bank material layers BNL1 and BNL2 may include the first bank material layer BNL1 and the second bank material layer BNL2 that are sequentially stacked. The first bank material layer BNL1 may be disposed (e.g., directly disposed) on the inorganic insulating layer ISL, and the second bank material layer BNL2 may be disposed on the first bank material layer BNL1. The bank material layers BNL1 and BNL2 may be partially etched in a subsequent process to form the bank layers BN1 and BN2 of the bank member BNS illustrated in FIG. 6, respectively. The first bank material layer BNL1 and the second bank material layer BNL2 may include different metal materials to form the first bank layer BN1 and the second bank layer BN2, respectively.

In an embodiment, the inorganic insulating layer ISL may have a thickness greater than that of the second bank material layer BNL2 but less than that of the first bank material layer BNL1. For example, thicknesses of the inorganic insulating layer ISL, the first bank material layer BNL1, and the second bank material layer BNL2 may be 2000 Å, 5000 Å, and 1500 Å, respectively. For example, the inorganic insulating layer ISL may include silicon nitride ($SiN_x$), the first bank material layer BNL1 may include aluminum (Al) or molybdenum (Mo), and the second bank material layer BNL2 may include titanium (Ti).

Figure 10:
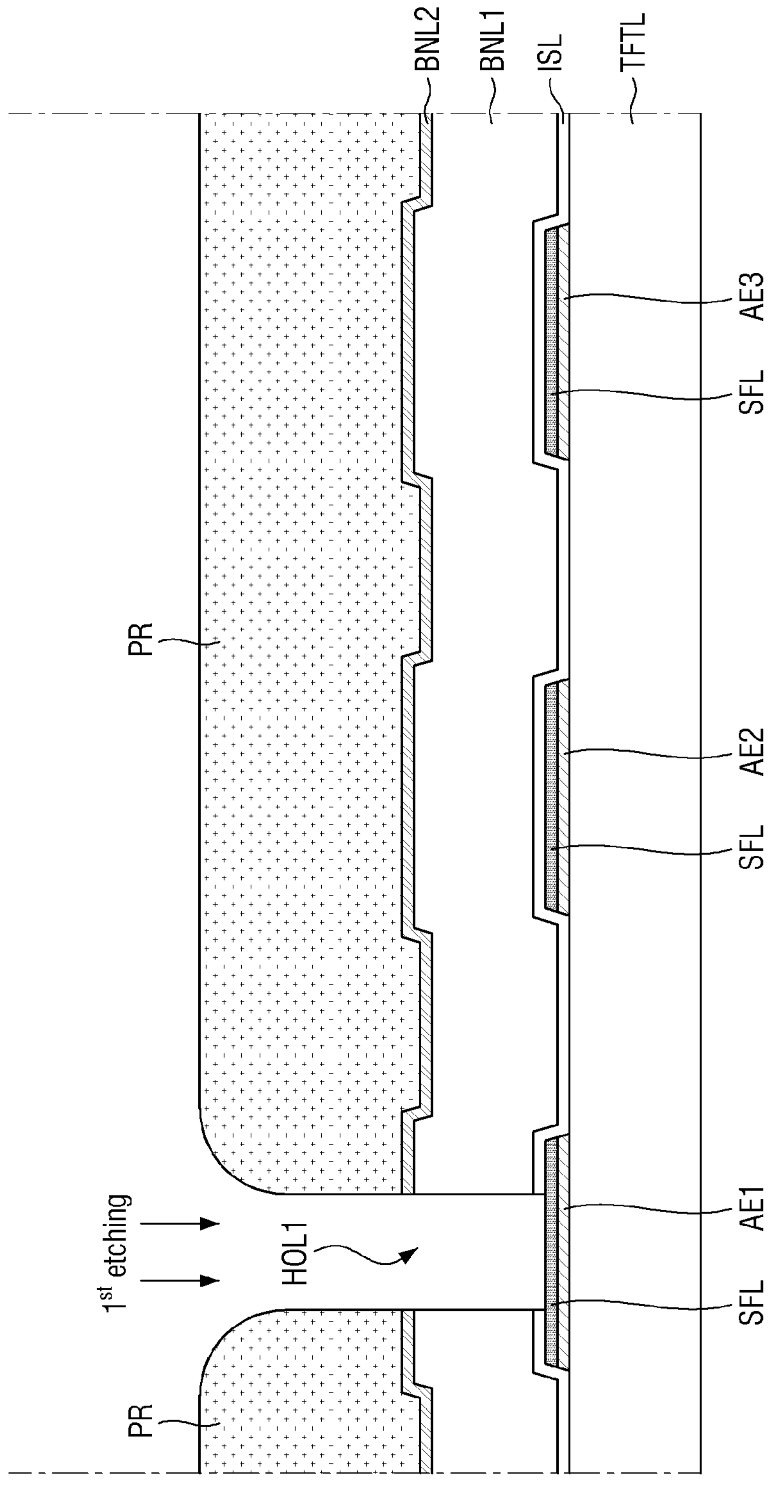

Referring to FIG. 10, photoresists PR may be formed on the bank material layers BNL1 and BNL2, and a first etching process ($1^{st}$ etching) for etching some of the bank material layers BNL1 and BNL2 by using the photoresist PR as a mask is performed to form a first hole HOL1.

The photoresists PR may be disposed on the bank material layers BNL1 and BNL2 to be spaced apart from each other. The photoresists PR may not overlap the first anode electrode AE1 on the second bank material layer BNL2, and may expose portions of the bank material layers BNL1 and BNL2 overlapping the first anode electrode AE1.

In an embodiment, the first etching process ($1^{st}$ etching) may be performed as a dry etching process. Since the first etching process ($1^{st}$ etching) is performed as a dry etching process, the bank material layers BNL1 and BNL2 including different materials may be anisotropically etched. In this process, the bank material layers BNL1 and BNL2 and a part of the inorganic insulating layer ISL may be etched together to partially expose the sacrificial layer SFL disposed thereunder. The first hole HOL1 may be formed in the regions overlapping the anode electrodes AE1, AE2, and AE3, and the first hole HOL1 may form the openings OPE1, OPE2, and OPE3 of the bank member BNS.

In this process, the bank material layers BNL1 and BNL2 and the inorganic insulating layer ISL may be simultaneously etched in a direction perpendicular to the top surface (or upper surface) of the thin film transistor layer TFTL. The inner sidewalls of the bank material layers BNL1 and BNL2 exposed by the first hole HOL1 and the inner sidewalls exposed by etching the inorganic insulating layer ISL may be formed in parallel. According to the etching direction of the first etching process (1st etching), the inner sidewalls of the bank material layers BNL1 and BNL2 and the inorganic insulating layer ISL may form a plane perpendicular to the top surface (or upper surface) of the thin film transistor layer TFTL.

Figure 11:
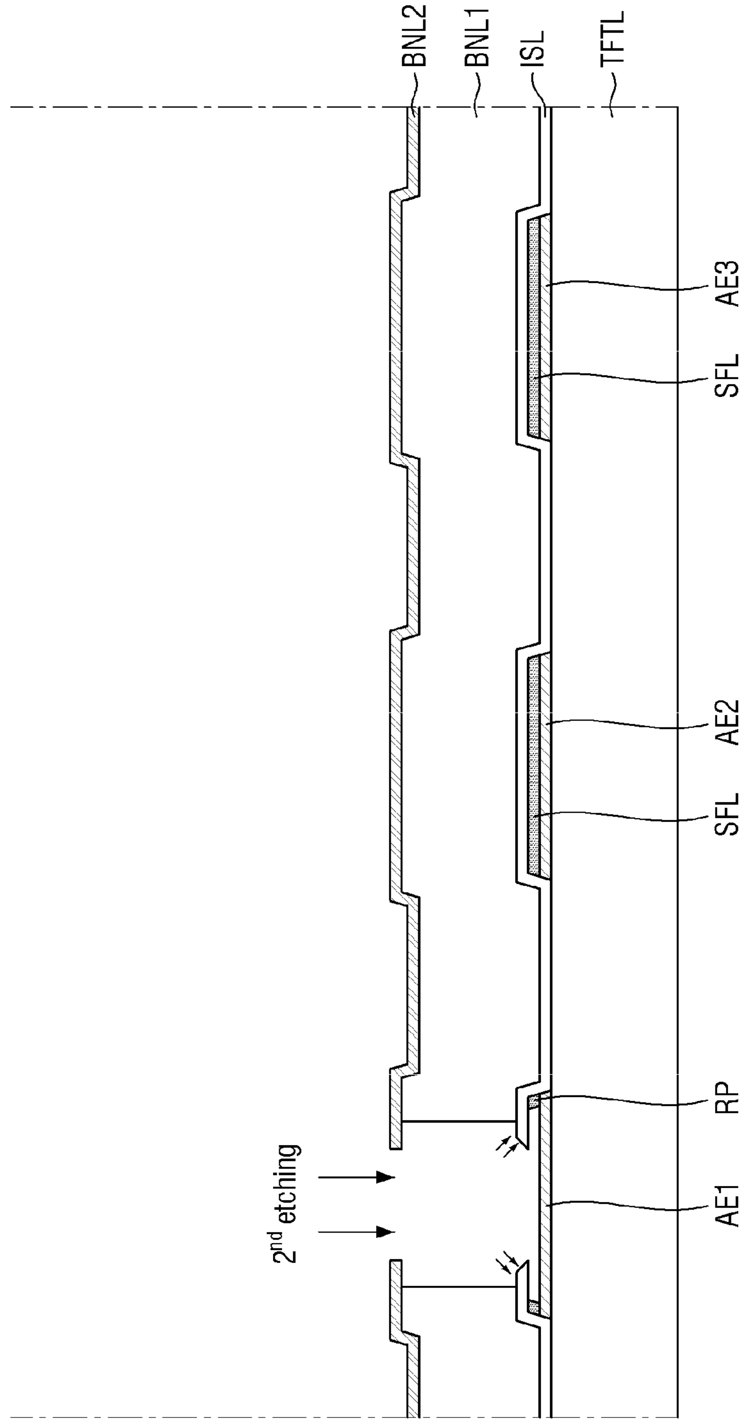

Referring to FIG. 11, a second etching process (2nd etching) for removing the sacrificial layer SFL disposed on the first anode electrode AE1 may be performed. In an embodiment, the sacrificial layer SFL may include an oxide semiconductor layer, and the second etching process (2nd etching) may be performed as a wet etching process. In this process, the inner sidewall of the first hole HOL1 may be isotropically etched by the removal of the sacrificial layer SFL. Among the bank material layers BNL1 and BNL2, the first bank material layer BNL1 may have an etching rate faster than those of other bank material layers, and the second bank material layer BNL2 may have the tip portion TIP protruding more than the lateral side of the first bank material layer BNL1. On the lateral side of the first bank material layer BNL1, the undercut portion may be formed under the tip portion TIP of the second bank material layer BNL2. The first hole HOL1 may form the first opening OPE1 or the first emission area EA1 by the second etching process (2nd etching).

In case that the first bank material layer BNL1 is further etched in the first hole HOL1, the first bank material layer BNL1 may overlap the anode electrodes AE1, AE2, and AE3. For example, the diameter of the opening formed in the first bank material layer BNL1 in the first hole HOL1 may be smaller than the diameters of the anode electrodes AE1, AE2, and AE3. As the outer portions of the anode electrodes AE1, AE2, and AE3 overlap the first bank material layer BNL1, the tip portion TIP of the second bank material layer BNL2 formed in the second etching process (2nd etching) and the sidewall of the opening of the inorganic insulating layer ISL may be prevented from sagging (or bending).

A part of the sacrificial layer SFL exposed by the first hole HOL1 and a portion between the inorganic insulating layer ISL and the first anode electrode AE1 may be removed. However, the sacrificial layer SFL may not be completely removed, and may remain as the partial residual pattern layer RP between the inorganic insulating layer ISL and the first anode electrode AE1. As a portion remaining after the sacrificial layer SFL is removed, a space may be formed between the first anode electrode AE1 and the inorganic insulating layer ISL disposed thereon. In a subsequent process, the first light emitting layer EL1 disposed on the first anode electrode AE1 may be formed to fill the space.

For example, a part of the inorganic insulating layer ISL may also be etched in a second etching process (2nd etching). The inorganic insulating layer ISL may have a shape in which an inner sidewall of a portion etched in the first etching process (1st etching) is further etched in a second etching process (2nd etching), and the periphery of the opening area is inclined. Unlike the tip portion TIP of the second bank material layer BNL2, the end portion of the inorganic insulating layer ISL may have a gentle slope, and the respective end portions may have different slopes. As a trimming process in which the inorganic insulating layer ISL is partially etched in the second etching process (2nd etching) is performed, a slope from the top surfaces (or upper surfaces) of the anode electrodes AE1, AE2, and AE3 to the top surface (or upper surface) of the inorganic insulating layer ISL may be gentle. In a deposition process described later, materials of the light emitting layers EL1, EL2, and EL3 may be smoothly deposited along a gentle slope from the top surfaces (or upper surfaces) of the anode electrodes AE1, AE2, and AE3 to the top surface (or upper surface) of the inorganic insulating layer ISL.

Figure 12:
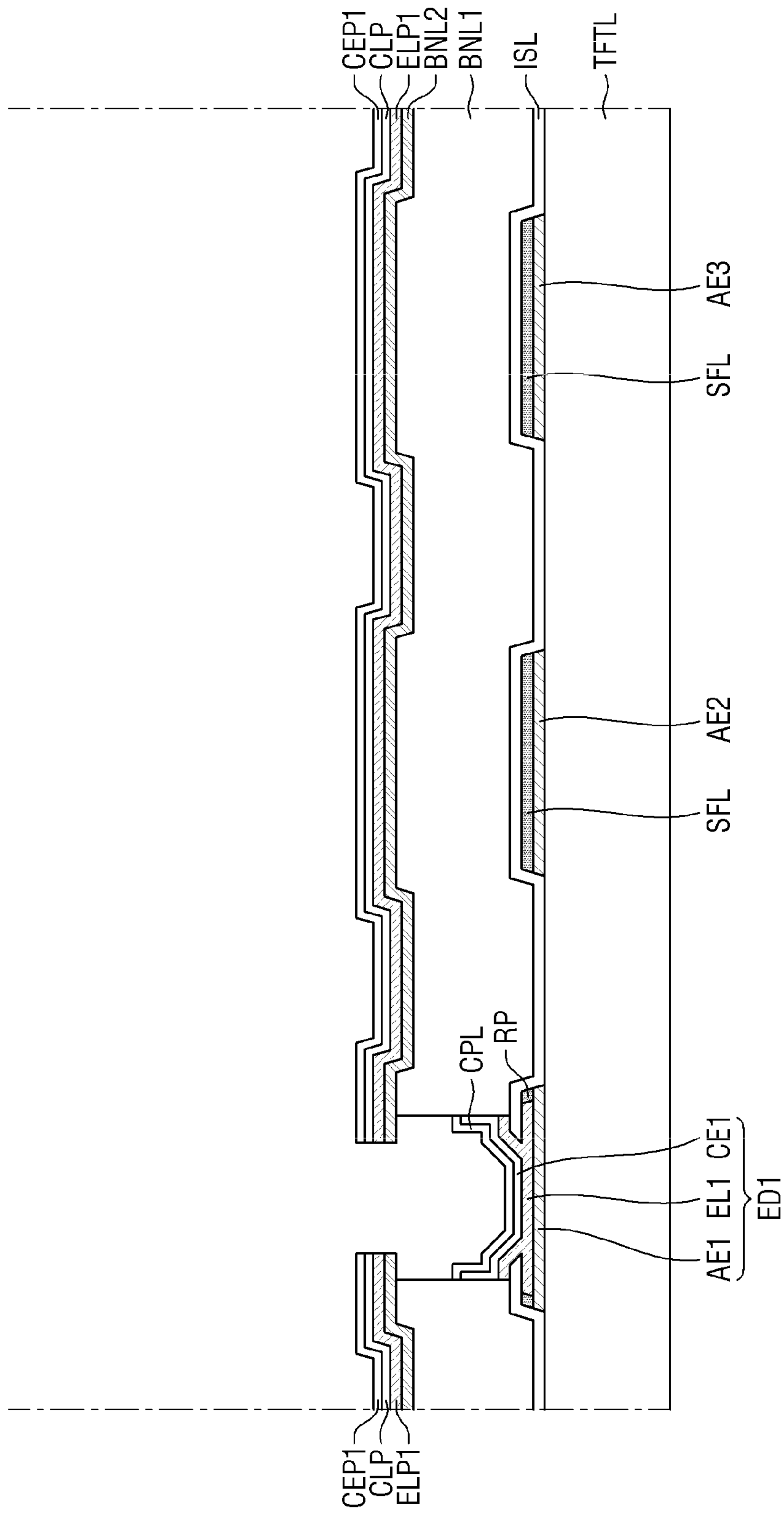

Referring to FIG. 12, the first light emitting element ED1 may be formed by depositing the first light emitting layer EL1, the first cathode electrode CE1, and the capping layer CPL on the first anode electrode AE1. The first light emitting layer EL1 and the first cathode electrode CE1 may be formed in the first opening OPE1, and in the deposition process, the materials forming the first light emitting layer EL1 and the first cathode electrode CE1 may also be deposited on the second bank material layers BNL2 to form a plurality of pattern layers. For example, some of the materials may be deposited on the second bank material layer BNL2 to form the first organic pattern layer ELP1 and the first electrode pattern layer CEP1. A part of the capping layer CPL may be disposed in the first opening OPEL to cover the first light emitting element ED1, and another part of the capping layer CPL may be disposed on the second bank material layer BNL2 to form the first organic pattern layer ELP1 and the first electrode pattern layer CEP1. The description of the structure of the first light emitting layer EL1, the first cathode electrode CE1, the first organic pattern layer ELP1, and the first electrode pattern layer CEP1 is the same as described above.

For example, the first light emitting layer EL1 and the first cathode electrode CE1 may be formed by a deposition process. The deposition of the material may not be smooth in the first opening OPE1 by the tip portion TIP of the second bank material layer BNL2. Since, however, the materials of the first light emitting layer EL1 and the first cathode electrode CE1 are deposited in an inclined direction rather than a direction perpendicular to the top surface (or upper surface) of the substrate, they may be deposited even in the region hidden by the tip portion TIP of the first bank material layer BNL1.

For example, the deposition process of forming the first light emitting layer EL1 may be performed such that the materials may be deposited in a direction not perpendicular to the top surface (or upper surface) of the first anode electrode AE1, for example, in a direction inclined at a first angle. In an embodiment, in the process of forming the light emitting layers EL1, EL2, and EL3, the deposition of the material may be performed at an angle of about 45° to about 50° inclined from the top surfaces (or upper surfaces) of the anode electrodes AE1, AE2, and AE3. The first light emitting layer EL1 may be formed to fill a space between the first anode electrode AE1 and the inorganic insulating layer ISL, and may also be formed in the region hidden by the tip portion TIP of the second bank material layer BNL2. For example, the first light emitting layer EL1, may be partially disposed on the side surface of the first bank material layer BNL1, which is the region hidden by the tip portion TIP.

The deposition process of forming the first cathode electrode CE1 may be performed such that the materials may be deposited in a direction not perpendicular to the top surface (or upper surface) of the first anode electrode AE1, for example, in a direction inclined at a second angle. In an embodiment, in the process of forming the cathode electrodes CE1, CE2, and CE3, the deposition of the material may be performed at an angle of about 30° or less inclined from the top surfaces (or upper surfaces) of the anode electrodes AE1, AE2, and AE3. The first cathode electrode CE1 may be disposed on the first light emitting layer EL1 and may also be formed in the region hidden by the tip portion TIP of the second bank material layer BNL2. For example, the first cathode electrode CE1 may be partially disposed on the side surface of the first bank material layer BNL1, which is the region hidden by the tip portion TIP.

The deposition process of forming the cathode electrodes CE1, CE2, and CE3 may be performed at an angle inclined to be relatively closer to a horizontal direction as compared to the deposition process of forming the light emitting layers EL1, EL2, and EL3. Accordingly, the cathode electrodes CE1, CE2, and CE3 may be in contact with the side surface of the first bank layer BN1 or the first bank material layer BNL1 in larger areas as compared to the light emitting layers EL1, EL2, and EL3. In another example, the cathode electrodes CE1, CE2, and CE3 may be deposited to higher positions on the side surface of the first bank layer BN1 or the first bank material layer BNL1 as compared to the light emitting layers EL1, EL2, and EL3. The different cathode electrodes CE1, CE2, and CE3 may be connected (e.g., electrically connected) to each other with being in contact with the first bank layer BN1 or the first bank material layer BNL1 having high conductivity.

Figure 13:
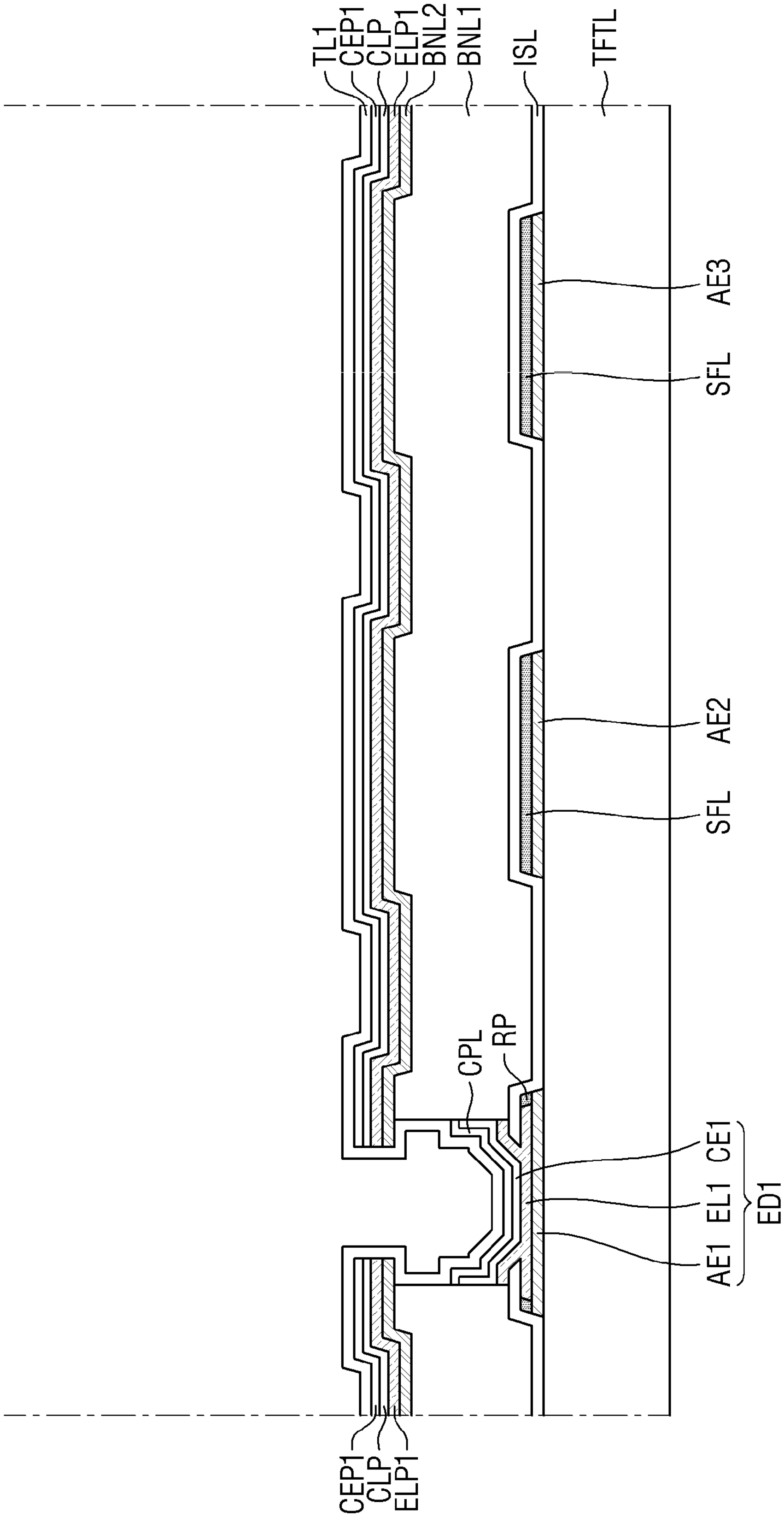

Referring to FIG. 13, the first inorganic layer TL1 covering the first light emitting element ED1 and the capping layer CPL may be formed. Unlike the light emitting layers EL1, EL2, and EL3 and the cathode electrodes CE1, CE2, and CE3, the first inorganic layer TL1 may be formed by a chemical vapor deposition (CVD) process, and the first inorganic layer TL1 may form a uniform film regardless of the stepped portion of the deposited portion. The first inorganic layer TL1 may be formed to cover (e.g., completely cover) the outer surfaces of the first light emitting element ED1, the bank material layers BNL1 and BNL2, and the capping layer CPL. For example, the first inorganic layer TL1 may also be deposited under the tip portion TIP of the second bank material layer BNL2.

Figure 14:
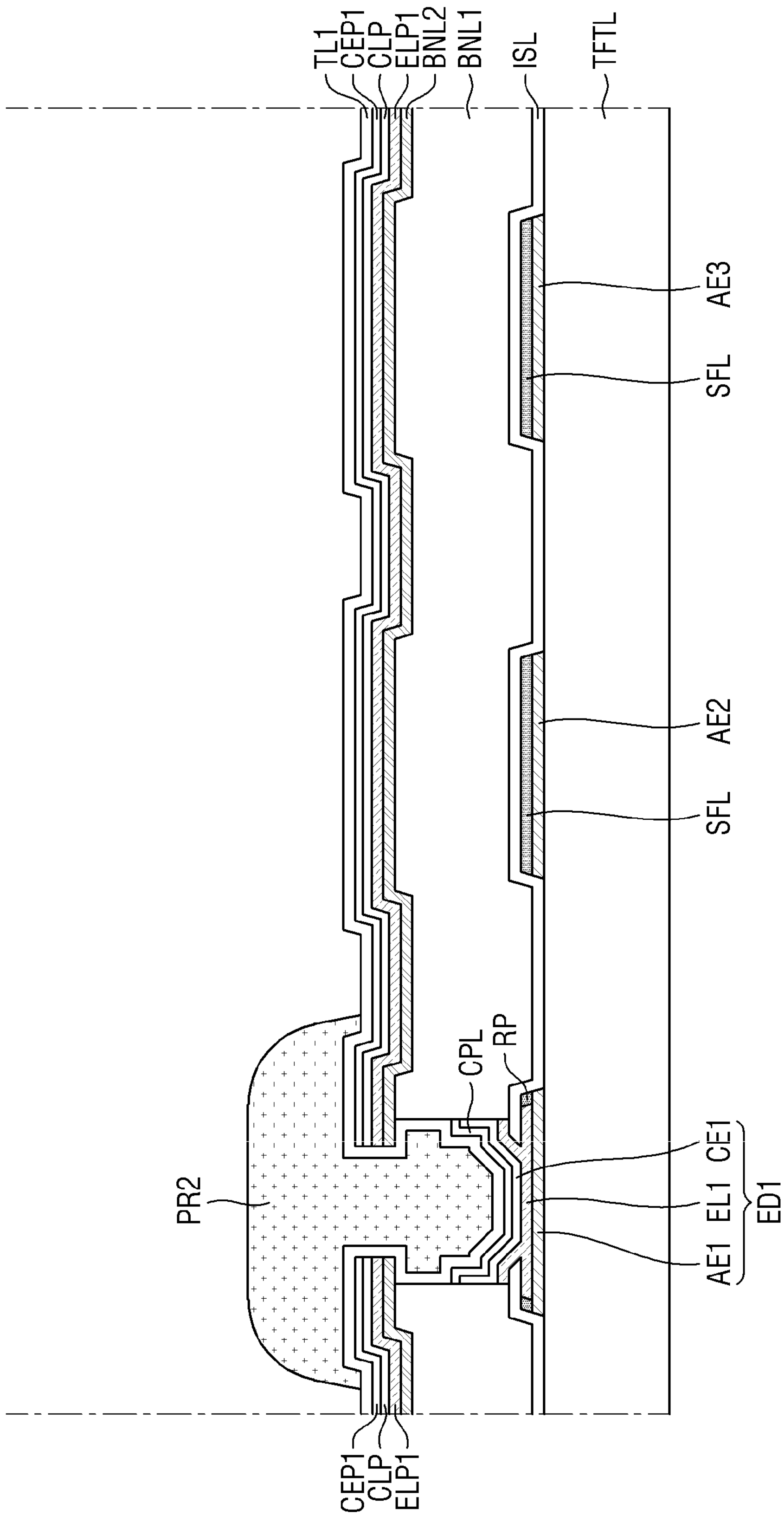
Figure 15:
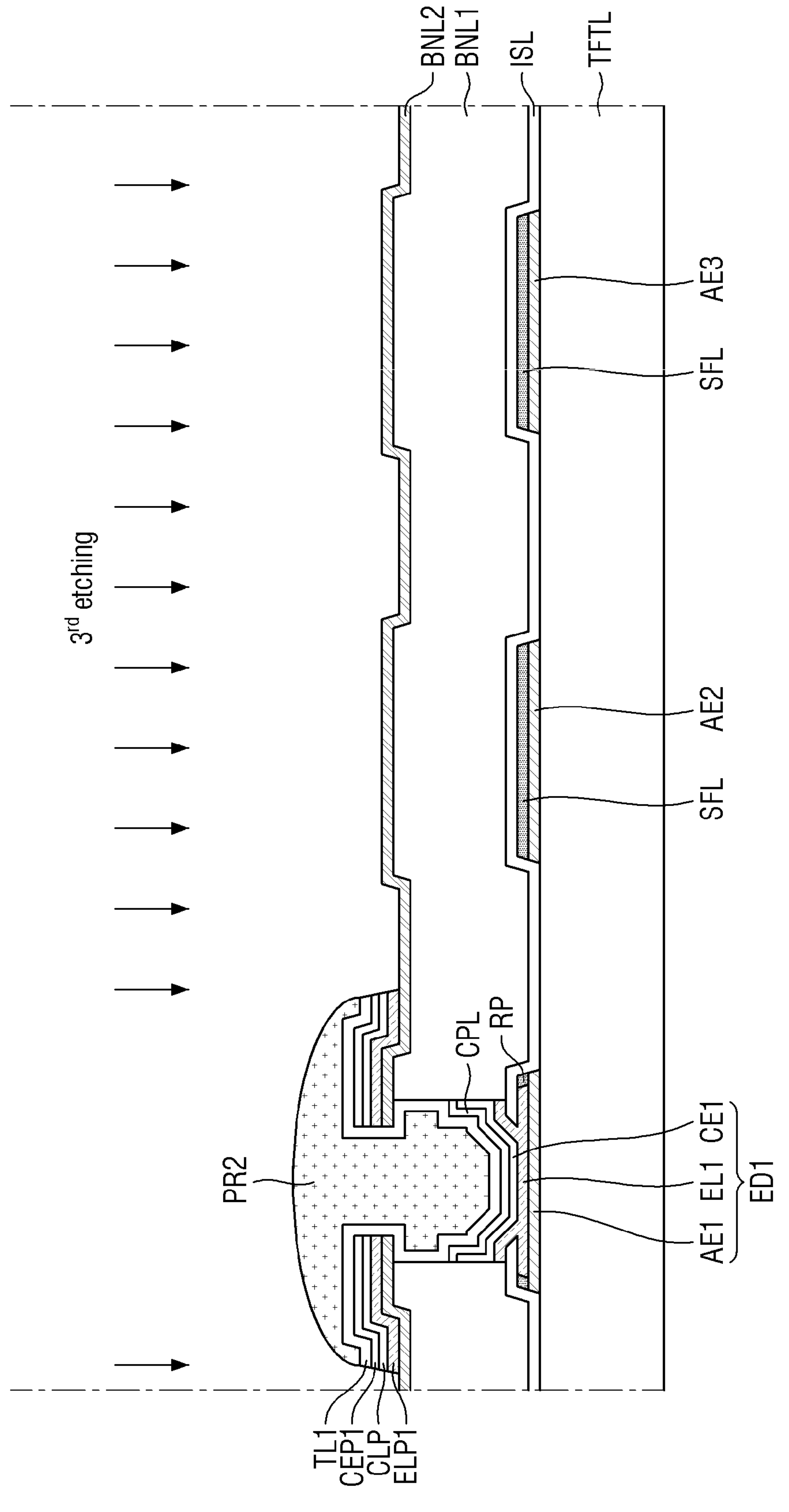

Referring to FIGS. 14 and 15, a second photoresist PR2 may be formed on the first inorganic layer TL1, and a third etching process ($3^{rd}$ etching) of partially removing the first organic pattern layer ELP1, the first electrode pattern layer CEP1, the capping layer CPL, and the first inorganic layer TL1 disposed on the bank material layers BNL1 and BNL2 may be performed.

In this process, the second photoresist PR2 may be disposed in the first opening OPEL to overlap the first light emitting element ED1. The first organic pattern layer ELP1, the first electrode pattern layer CEP1, the capping pattern layer CLP, and the first inorganic layer TL1 disposed on the bank material layers BNL1 and BNL2 may be completely removed except the periphery of the first light emitting element ED1 or the first opening OPE1. In the process, the region of the second bank material layer BNL2 except the periphery of the first light emitting element ED1 or the first opening OPE1 may be exposed. In an embodiment, the third etching process ($3^{rd}$ etching) for removing the first inorganic layer TL1 disposed on the bank material layers BNL1 and BNL2 may be performed as a dry etching process by using a fluorine (F)-based etchant. The second photoresist PR2 may function as a mask for etching the first organic pattern layer ELP1, the first electrode pattern layer CEP1, the capping pattern layer CLP, and the first inorganic layer TL1, and end portions of the etched first organic pattern layer ELP1, first electrode pattern layer CEP1, capping pattern layer CLP, and first inorganic layer TL1 may be substantially aligned to the end portion of the second photoresist PR2.

Figure 16:
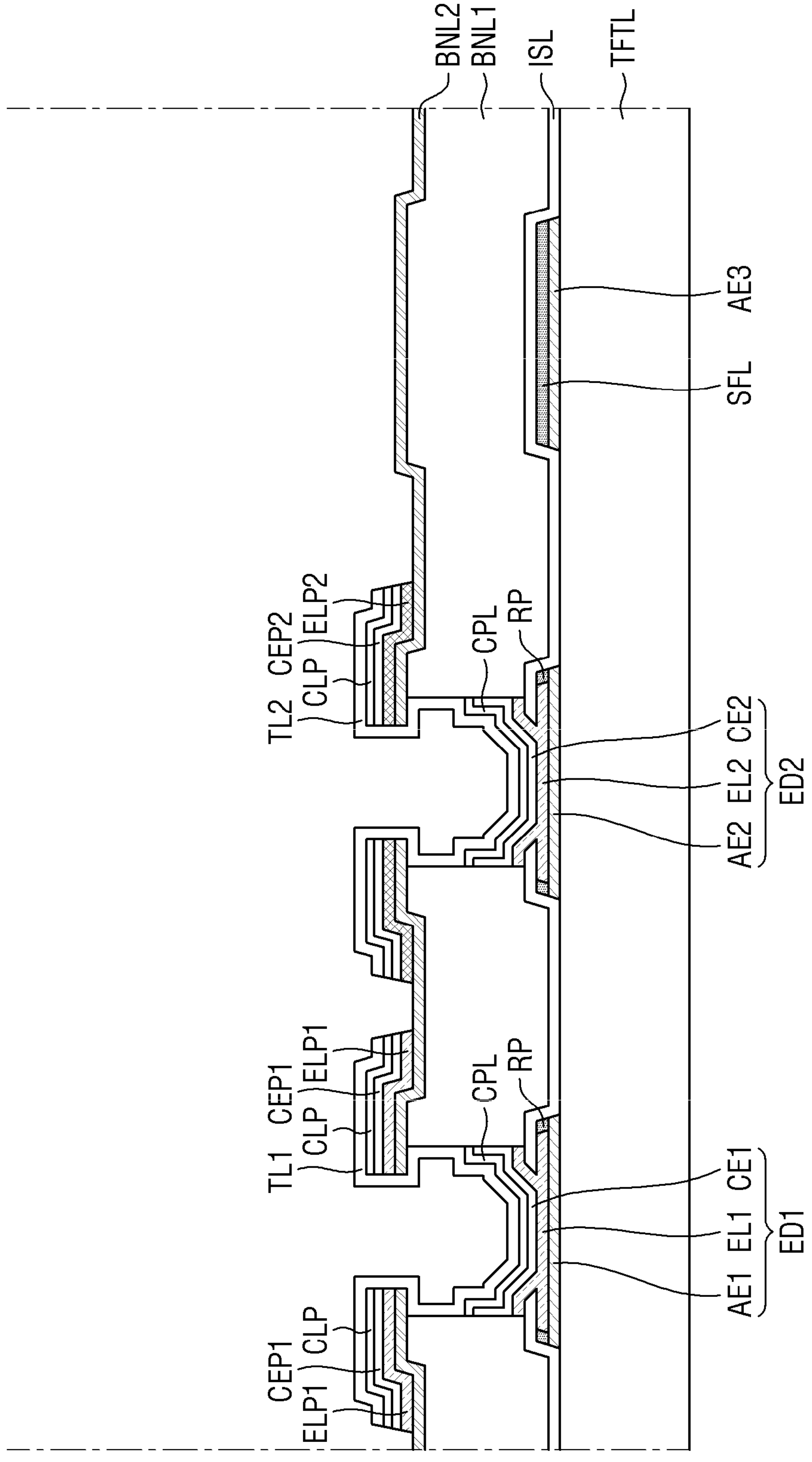
Figure 17:
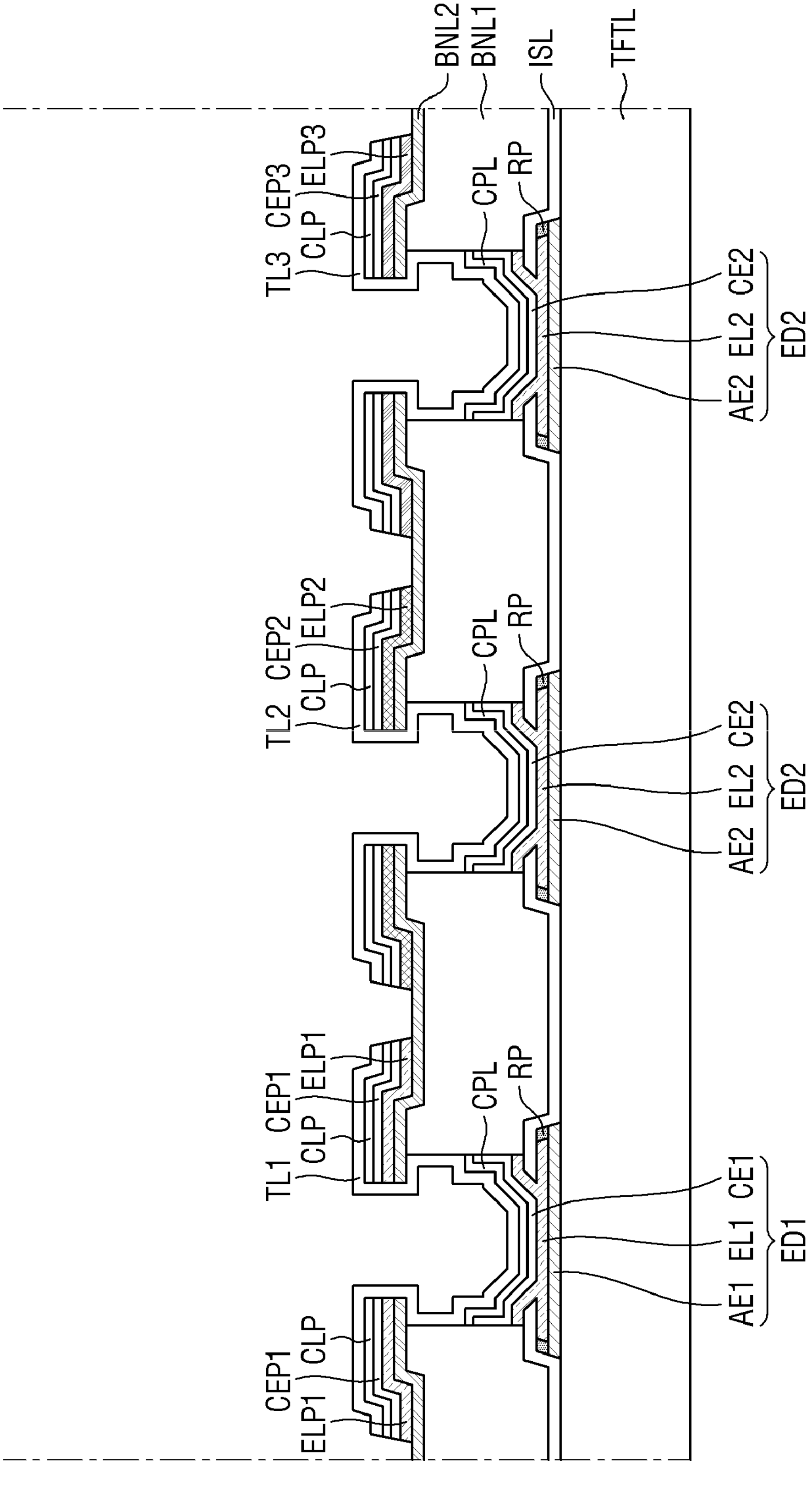

By the above processes, the first light emitting element ED1, and the first inorganic layer TL1 covering the first light emitting element ED1, the first organic pattern layer ELP1, the first electrode pattern layer CEP1, and the capping layer PL may be formed. Referring to FIGS. 16 and 17, the second light emitting element ED2, the third light emitting element ED3, the second and third organic pattern layers ELP2 and ELP3, the second and third electrode pattern layers CEP2 and CEP3, the second inorganic layer TL2, and the third inorganic layer TL3 may be formed by repeating processes similar to the above-described processes.

For example, the thin film encapsulation layer TFEL may be formed by forming the second encapsulation layer TFE2 and the third encapsulation layer TFE3 on the first encapsulation layers TFE1 and the bank member BNS, and the touch sensing layer TSU, the light blocking layer BM, the color filter layer CFL, and the overcoat layer OC may be formed, thereby manufacturing the display device 10.

Figure 18:
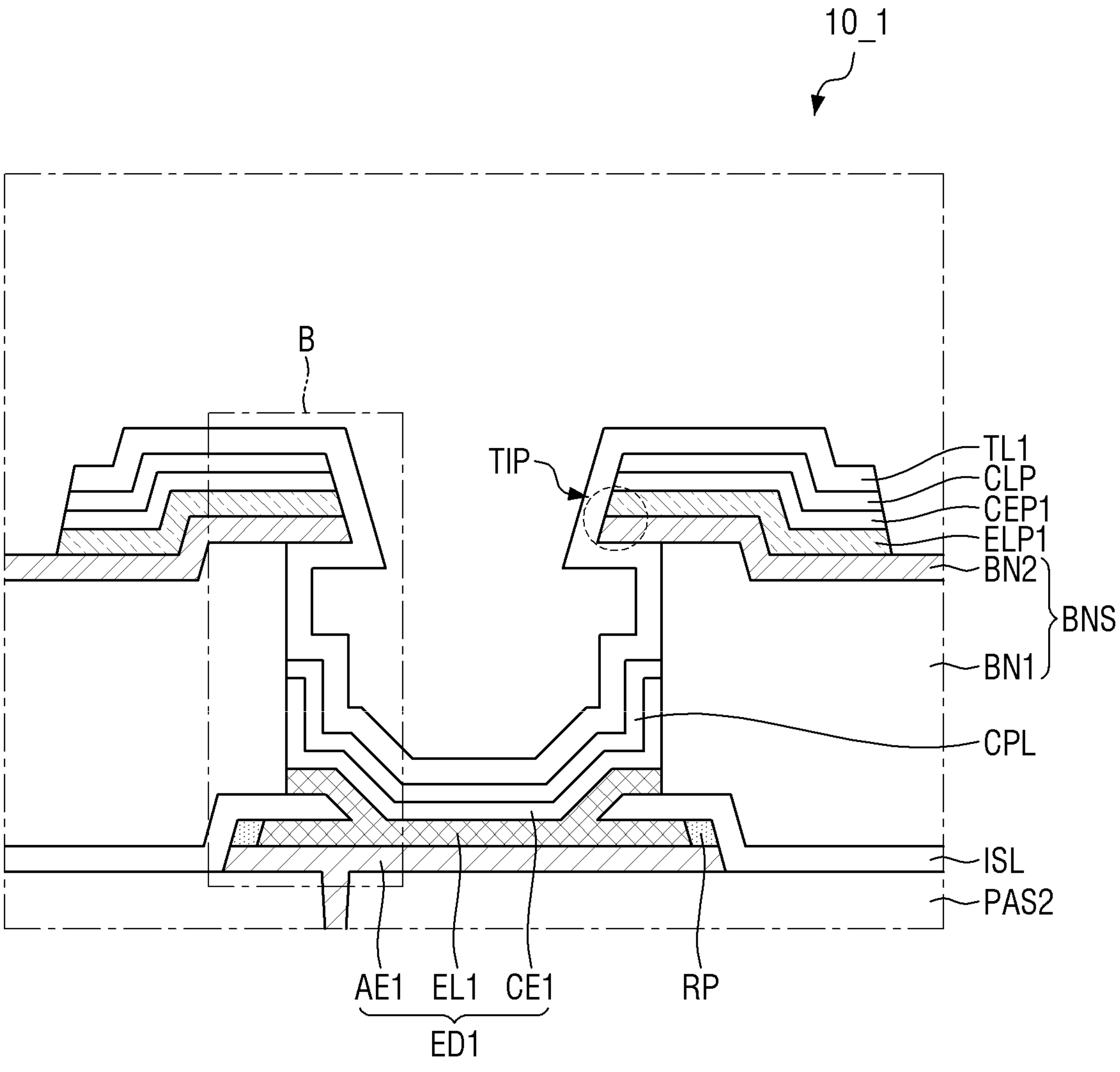
FIG. 18 is a schematic cross-sectional view illustrating a part of a display device according to an embodiment.
Figure 19:
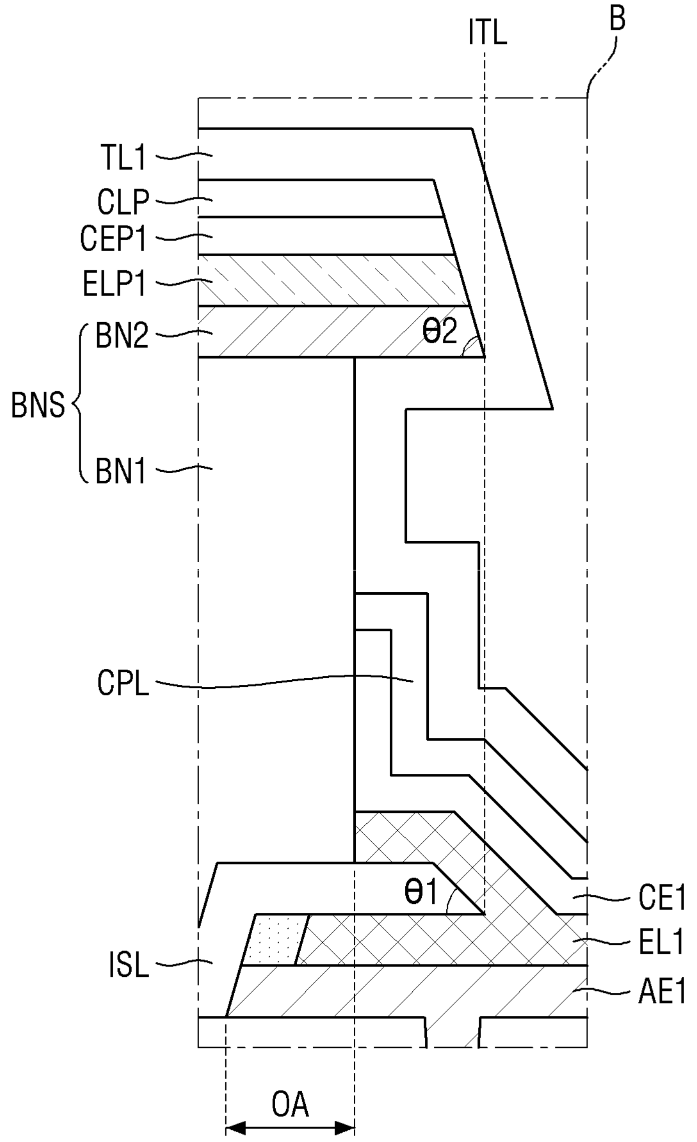
FIG. 19 is an enlarged schematic view of part B of FIG. 18.

FIG. 18 is a schematic cross-sectional view illustrating a part of a display device according to an embodiment. FIG. 19 is an enlarged schematic view of part B of FIG. 18.

Referring to FIGS. 18 and 19, the end portion of the tip portion TIP formed in the second bank layer BN2 of the bank member BNS may be formed substantially aligned to the end portion of the opening of the inorganic insulating layer ISL. In a display device 10_1, the sidewall of the second bank layer BN2 in contact with the openings OPE1, OPE2, and OPE3 of the bank member BNS and the sidewall in contact with the opening exposing the anode electrodes AE1, AE2, and AE3 of the inorganic insulating layer ISL may be disposed on (or aligned along) the same virtual line. A description thereof is the same as described above with reference to FIG. 8.

The end portion of the second bank layer BN2 or the sidewall in contact with the openings OPE1, OPE2, and OPE3 and the end portion of the inorganic insulating layer ISL or the sidewall in contact with the opening may be formed substantially aligned to each other, but may have different shapes. In an embodiment, the end portion of the second bank layer BN2 and the sidewall or end portion of the opening of the inorganic insulating layer ISL may each have an inclined shape, but the end portion of the inorganic insulating layer ISL may have a gentler slope. For example, in the inorganic insulating layer ISL, a first angle θ1 formed between the bottom surface (or lower surface) and the sidewall may be smaller than a second angle θ2 formed between the bottom surface (or lower surface) and the sidewall at the end portion of the second bank layer BN2.

However, apart from a shape in which the end portion of the second bank layer BN2 and the end portion of the inorganic insulating layer ISL are inclined, an imaginary line (or virtual line) ITL on which the end portion of the second bank layer BN2 and the end portion of the inorganic insulating layer ISL are disposed may extend in a direction perpendicular to the top surface (or upper surface) of the substrate SUB. The display device 10_1 according to the embodiment is the same as the embodiment of FIG. 8 in that the end portion of the second bank layer BN2 and the end portion of the inorganic insulating layer ISL are formed side by side, but there is a difference in that only the shape of each end portion is different.

This may be because the first etching process ($1^{st}$ etching) of etching the bank material layers BNL1 and BNL2 and the inorganic insulating layer ISL in the manufacturing process of the display device 10 is performed in an inclined direction rather than a direction perpendicular to the top surface (or upper surface) of the substrate SUB. The inner sidewall of the first hole HOL1 formed in the first etching process ($1^{st}$ etching) may have a shape inclined rather than perpendicular to the top surface (or upper surface) of the substrate SUB, and the tip portion TIP of the second bank layer BN2 formed after the second etching process ($2^{nd}$ etching) and the end portion of the inorganic insulating layer ISL may have an inclined shape.

Figure 20:
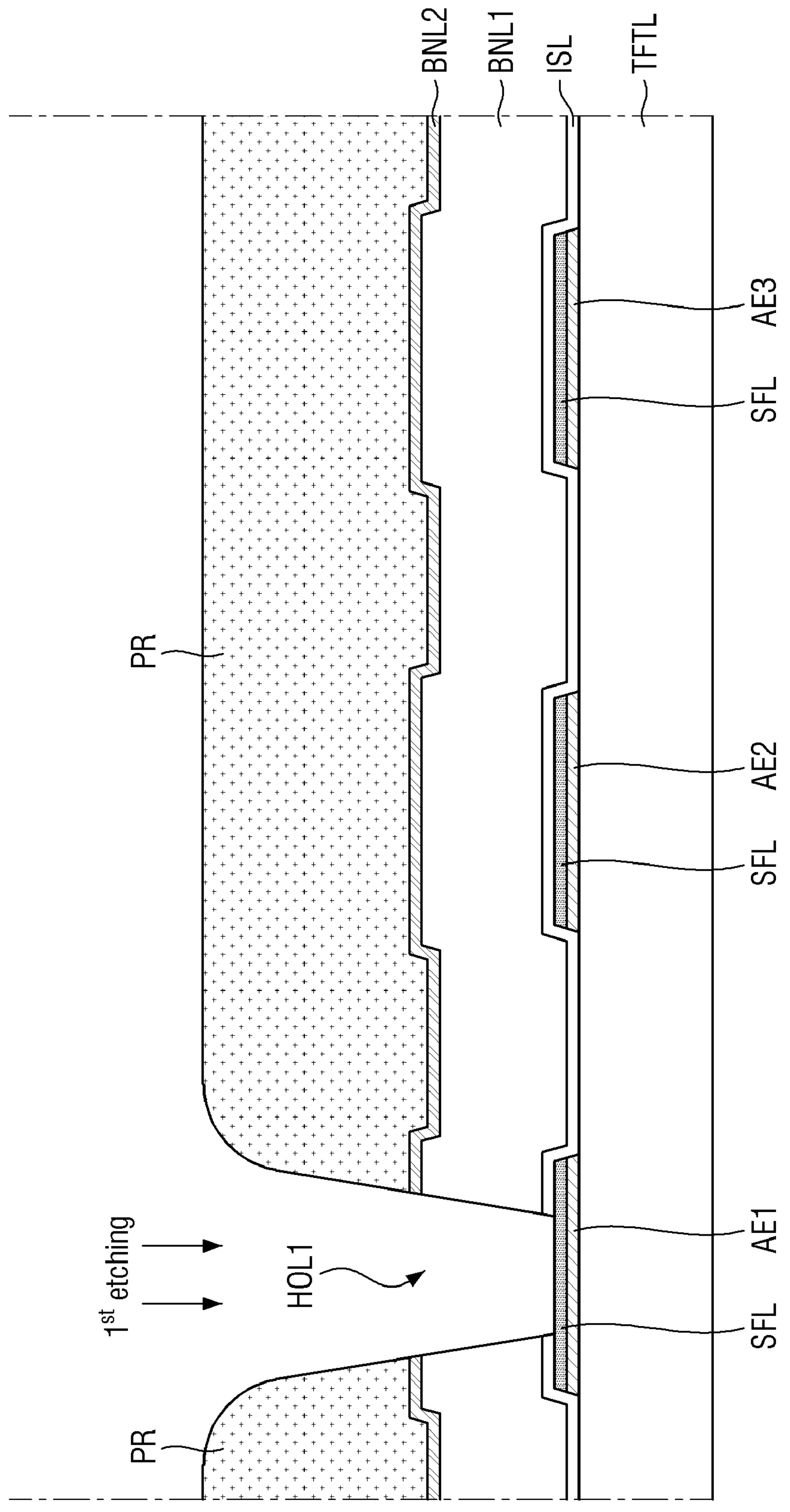
FIGS. 20 and 21 are schematic cross-sectional views illustrating some steps of the manufacturing process of the display device of FIG. 18.
Figure 21:
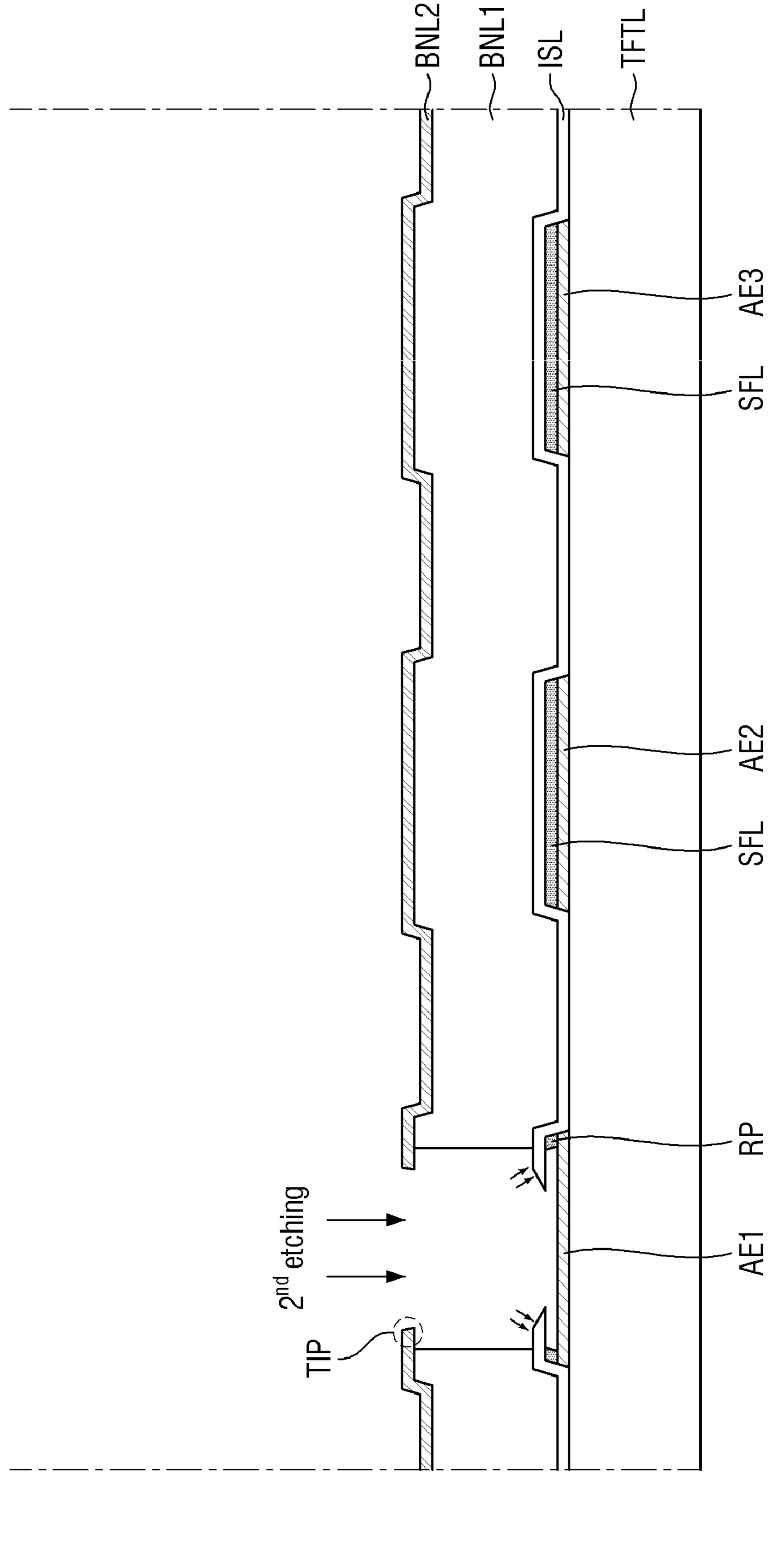

FIGS. 20 and 21 are schematic cross-sectional views illustrating some steps of the manufacturing process of the display device of FIG. 18.

Referring to FIGS. 20 and 21, the first etching process ($1^{st}$ etching) for etching the bank material layers BNL1 and BNL2 and the inorganic insulating layer ISL may be performed in an inclined direction rather than a direction perpendicular to the top surface (or upper surface) of the thin film transistor layer TFTL, and the inner sidewall of the first hole HOL1 may have an inclined shape. In the first etching process ($1^{st}$ etching), in each of the second bank material layer BNL2 and the inorganic insulating layer ISL, an inner sidewall portion of the first hole HOL1 may be formed to be inclined.

In the subsequent second etching process ($2^{nd}$ etching), the first bank material layer BNL1 may be further etched to form the tip portion TIP in the second bank material layer BNL2. In the second etching process ($2^{nd}$ etching), the end portion of the inorganic insulating layer ISL may be further etched and trimmed, and the end portion of the second bank material layer BNL2 and the end portion of the inorganic insulating layer ISL may be disposed on (or aligned along) the same virtual line perpendicular to the top surface (or upper surface) of the thin film transistor layer TFTL. For example, the inorganic insulating layer ISL may be trimmed in the second etching process ($2^{nd}$ etching) so that the lateral side or end portion of the opening may have a gentler slope than the tip portion TIP of the second bank material layer BNL2.

In concluding the detailed description, those skilled in the art will appreciate that many variations and modifications may be made to the embodiments without substantially departing from the principles of the disclosure. Therefore, the disclosed embodiments of the invention are used in a generic and descriptive sense only and not for purposes of limitation.

What is claimed is:

1. A display device comprising:

a plurality of anode electrodes spaced apart from each other on a substrate;

an inorganic insulating layer disposed on the substrate and the plurality of anode electrodes and exposing a part of each of the plurality of anode electrodes;

a bank member disposed on the inorganic insulating layer and comprising an opening overlapping the plurality of anode electrodes;

a light emitting layer disposed on each of the plurality of anode electrodes and including at least a portion disposed on the inorganic insulating layer; and a cathode electrode disposed on the light emitting layer and including at least a portion in contact with the bank member, wherein the bank member comprises:

a first bank layer, and a second bank layer disposed on the first bank layer, including a metal material different from that of the first bank layer, and comprising a tip portion protruding than the first bank layer at a sidewall of the opening of the bank member, and a lateral side of the inorganic insulating layer defining a pattern opening exposing the anode electrode and an end portion of the tip portion of the second bank layer are substantially aligned to each other, and wherein a first angle between a lower surface and the lateral side of the inorganic insulating layer is smaller than a second angle between a lower surface and a lateral side of the tip portion of the second bank layer.

2. The display device of claim 1, wherein the end portion of the tip portion of the second bank layer and the lateral side of the inorganic insulating layer are aligned along a same virtual line extending in a direction perpendicular to an upper surface of the substrate.

3. The display device of claim 1, wherein the lateral side of the tip portion of the second bank layer extends in a direction perpendicular to an upper surface of the substrate.

4. The display device of claim 1, wherein the lateral side of the tip portion of the second bank layer and the lateral side of the inorganic insulating layer are inclined from a direction perpendicular to an upper surface of the substrate.

5. The display device of claim 1, wherein at least a part of each of the plurality of anode electrodes overlaps the first bank layer.

6. The display device of claim 5, wherein each of the plurality of anode electrodes has an outer portion which overlaps the first bank layer and does not overlap the pattern opening of the inorganic insulating layer.

7. The display device of claim 5, wherein a diameter of the opening of the first bank layer is smaller than a diameter of each of the plurality of anode electrodes.

8. The display device of claim 1, wherein a part of the inorganic insulating layer is spaced apart from an upper surface of each of the plurality of anode electrodes, the display device further comprises a residual pattern layer disposed between the inorganic insulating layer and the upper surface of each of the plurality of anode electrodes.

9. The display device of claim 8, wherein the inorganic insulating layer covers a side surface of each of the plurality of anode electrodes.

10. The display device of claim 1, wherein the first bank layer includes aluminum (Al) or molybdenum (Mo), and the second bank layer includes titanium (Ti).

11. The display device of claim 1, wherein a part of the light emitting layer is directly disposed on a side surface of the first bank layer, and the cathode electrode covers the light emitting layer and a part of the cathode electrode is disposed directly on the side surface of the first bank layer.

12. The display device of claim 11, wherein the light emitting layer and the cathode electrode are spaced apart from the second bank layer.

13. The display device of claim 1, further comprising:

an organic pattern layer disposed on the second bank layer, the organic pattern layer and the light emitting layer including a same material; and an electrode pattern layer disposed on the organic pattern layer, the electrode pattern layer and the cathode electrode including a same material.

14. A method of fabricating a display device, the method comprising:

forming a plurality of anode electrodes spaced apart from each other on a substrate, a sacrificial layer disposed on the plurality of anode electrodes, an inorganic insulating layer disposed on the substrate and the sacrificial layer, and a first bank material layer and a second bank material layer disposed on the inorganic insulating layer;

a first etching step of etching the first bank material layer, the second bank material layer, and the inorganic insulating layer to form a first hole exposing an upper surface of the sacrificial layer;

a second etching step of further etching the first bank material layer to remove a part of the sacrificial layer exposed by the first hole; and forming a light emitting layer disposed on each of the plurality of anode electrodes and a cathode electrode disposed on the light emitting layer in an opening formed by etching the first hole in the second etching step, and forming a first inorganic layer on the cathode electrode and the second bank material layer, wherein in the second etching step, the second bank material layer forms a tip portion protruding than a sidewall of the first bank material layer, and a lateral side of the inorganic insulating layer defining a pattern opening exposing the plurality of anode electrodes and an end portion of the tip portion of the second bank material layer are substantially aligned to each other, and in the second etching step, the inorganic insulating layer is partially etched, and a first angle between a lower surface and the lateral side of the inorganic insulating layer is smaller than a second angle between a lower surface and a lateral side of the tip portion of the second bank material layer.

15. The method of claim 14, wherein a diameter of each of the plurality of anode electrodes is greater than a diameter of the opening of the first bank material layer formed in the second etching step, and at least a part of each of the plurality of anode electrodes, which does not overlap the pattern opening of the inorganic insulating layer, overlaps the first bank material layer.

16. The method of claim 14, wherein the first etching step is performed in a direction perpendicular to an upper surface of the substrate, and at an inner sidewall of the first hole, sidewalls of the second bank material layer and the inorganic insulating layer are formed in a direction perpendicular to the upper surface of the substrate.

17. The method of claim 14, wherein the first etching step is performed in a direction inclined from a direction perpendicular to an upper surface of the substrate, and at an inner sidewall of the first hole, sidewalls of the second bank material layer and the inorganic insulating layer are formed to be inclined.

18. The method of claim 14, wherein a part of the light emitting layer and the cathode electrode is in direct contact with the first bank material layer on a sidewall in the opening.

19. An electronic device comprising:

a display device including a plurality of anode electrodes spaced apart from each other on a substrate;

an inorganic insulating layer disposed on the substrate and the plurality of anode electrodes and exposing a part of each of the plurality of anode electrodes;

a bank member disposed on the inorganic insulating layer and comprising an opening overlapping the plurality of anode electrodes;

a light emitting layer disposed on each of the plurality of anode electrodes and including at least a portion disposed on the inorganic insulating layer; and a cathode electrode disposed on the light emitting layer and including at least a portion in contact with the bank member, wherein the bank member comprises:

a first bank layer, and a second bank layer disposed on the first bank layer, including a metal material different from that of the first bank layer, and comprising a tip portion protruding than the first bank layer at a sidewall of the opening of the bank member, and a lateral side of the inorganic insulating layer defining a pattern opening exposing the anode electrode and an end portion of the tip portion of the second bank layer are substantially aligned to each other, and wherein a first angle between a lower surface and the lateral side of the inorganic insulating layer is smaller than a second angle between a lower surface and a lateral side of the tip portion of the second bank layer.

* * * * *